(12) United States Patent
Minamisawa et al.

(10) Patent No.: US 10,809,542 B2
(45) Date of Patent: Oct. 20, 2020

(54) ROLLING MAGNETIC DRIVING UNIT AND OPTICAL UNIT WITH SHAKE CORRECTION FUNCTION

(71) Applicant: NIDEC SANKYO CORPORATION, Nagano (JP)

(72) Inventors: Shinji Minamisawa, Nagano (JP); Takeshi Sue, Nagano (JP); Masato Gomyo, Nagano (JP)

(73) Assignee: NIDEC SANKYO CORPORATION, Nagano (JP)

( * ) Notice: Subject to any disclaimer, the term of this patent is extended or adjusted under 35 U.S.C. 154(b) by 155 days.

(21) Appl. No.: 15/972,239

(22) Filed: May 7, 2018

(65) Prior Publication Data

US 2018/0321462 A1 Nov. 8, 2018

(30) Foreign Application Priority Data

May 8, 2017 (JP) ................................. 2017-092233

(51) Int. Cl.
*G02B 27/64* (2006.01)
*G02B 7/10* (2006.01)
(Continued)

(52) U.S. Cl.
CPC ............. *G02B 27/646* (2013.01); *G02B 7/04* (2013.01); *G02B 7/102* (2013.01); *H02K 7/086* (2013.01);
(Continued)

(58) Field of Classification Search
CPC ...... G02B 27/646; G02B 7/023; G02B 7/102; G02B 13/001; G03B 5/00;
(Continued)

(56) References Cited

U.S. PATENT DOCUMENTS 5,506,732 A * 4/1996 Mori .................... G11B 7/0925
  359/814
5,920,437 A * 7/1999 Shirotori .................. G11B 7/22
  359/814
(Continued)

FOREIGN PATENT DOCUMENTS

CN  1924686  3/2007
CN  101762943  6/2010
(Continued)

OTHER PUBLICATIONS

"Office Action of Taiwan Counterpart Application," dated May 7, 2019, with English translation thereof, p. 1-p. 8.
(Continued)

*Primary Examiner* — Christopher Stanford
(74) *Attorney, Agent, or Firm* — JCIPRNET

(57) ABSTRACT

To provide a rolling magnetic driving unit that can be employed for both of an optical unit with shake correction function that causes an optical module to swing and rotate and an optical unit with shake correction function that causes the optical module to rotate, a second unit (i.e., a rolling magnetic driving unit) includes: a rotation seat; and a fixation member that supports the rotation seat via a bearing mechanism. The rotation seat and the bearing mechanism configure a rotation-supporting mechanism. The rotation-supporting mechanism supports a holder, which supports the optical module such that the optical module is able to swing, such the holder is able to rotate on the axis. Furthermore, the second unit includes a rolling magnetic driving mechanism, which includes a rolling driving coil that is held by the rotation seat and a rolling driving magnet that is held by the fixation member.

18 Claims, 18 Drawing Sheets

(51) Int. Cl.
*H02K 21/26* (2006.01)
*H02K 7/08* (2006.01)
*H05K 1/02* (2006.01)
*H02K 11/22* (2016.01)
*H02K 11/33* (2016.01)
*H02K 7/14* (2006.01)
*H02K 11/215* (2016.01)
*H02K 21/24* (2006.01)
*G02B 7/04* (2006.01)
*H05K 1/18* (2006.01)
*G02B 13/00* (2006.01)
*G02B 7/02* (2006.01)

(52) U.S. Cl.
CPC ............. *H02K 7/14* (2013.01); *H02K 11/215* (2016.01); *H02K 11/22* (2016.01); *H02K 11/33* (2016.01); *H02K 21/24* (2013.01); *H02K 21/26* (2013.01); *H05K 1/028* (2013.01); *G02B 7/023* (2013.01); *G02B 13/001* (2013.01); *G03B 2205/0015* (2013.01); *G03B 2205/0023* (2013.01); *G03B 2205/0069* (2013.01); *H02K 2201/18* (2013.01); *H05K 1/189* (2013.01); *H05K 2201/10121* (2013.01)

(58) Field of Classification Search
CPC ............. G03B 2205/0069; G03B 5/02; G03B 2205/0015; G03B 2205/0023; G03B 2205/0007; G03B 2205/0053
See application file for complete search history.

(56) References Cited

U.S. PATENT DOCUMENTS

| | | | | |
|---|---|---|---|---|
| 6,288,853 | B1 * | 9/2001 | Kamada | G11B 7/0933 359/814 |
| 7,719,396 | B2 * | 5/2010 | Umeda | G02B 7/003 335/296 |
| 7,720,366 | B2 * | 5/2010 | Iwasaki | G02B 27/646 348/208.99 |
| 8,139,291 | B2 * | 3/2012 | Nakamura | G03B 5/00 359/557 |
| 8,396,357 | B2 * | 3/2013 | Yanagisawa | H04N 5/2254 396/55 |
| 8,660,416 | B2 * | 2/2014 | Asakawa | G03B 5/00 396/55 |
| 8,711,497 | B2 * | 4/2014 | Machida | G02B 7/04 359/824 |
| 9,332,188 | B2 * | 5/2016 | Takei | H04N 5/2328 |
| 9,523,862 | B2 * | 12/2016 | Hattori | G02B 27/646 |
| 9,664,921 | B2 * | 5/2017 | Asakawa | H02K 41/031 |
| 9,720,252 | B2 * | 8/2017 | Asakawa | G02B 27/646 |
| 10,110,816 | B2 * | 10/2018 | Asakawa | G03B 17/561 |
| 10,356,292 | B2 * | 7/2019 | Minamisawa | H04N 5/2328 |
| 10,598,953 | B2 * | 3/2020 | Minamisawa | G02B 27/646 |
| 2007/0127904 | A1 * | 6/2007 | Iwasaki | G02B 7/102 396/55 |
| 2010/0202766 | A1 * | 8/2010 | Takizawa | G03B 5/00 396/55 |
| 2012/0155843 | A1 * | 6/2012 | Takizawa | G03B 5/00 396/55 |
| 2012/0182472 | A1 * | 7/2012 | Inata | G03B 5/00 348/374 |
| 2013/0194683 | A1 * | 8/2013 | Machida | H02K 41/0356 359/814 |
| 2016/0216528 | A1 | 7/2016 | Asakawa et al. | |

FOREIGN PATENT DOCUMENTS

| | | |
|---|---|---|
| CN | 102348062 | 2/2016 |
| JP | 2007271991 | 10/2007 |
| JP | 2015064501 | 4/2015 |
| TW | 201539109 | 10/2015 |
| TW | 201638629 | 11/2016 |

OTHER PUBLICATIONS

"Office Action of China Counterpart Application", dated May 15, 2020, with English translation, p. 1-p. 15.

* cited by examiner

ROLLING MAGNETIC DRIVING UNIT AND OPTICAL UNIT WITH SHAKE CORRECTION FUNCTION

CROSS REFERENCE TO RELATED APPLICATION

The present application claims priority under 35 U.S.C. § 119 to Japanese Application No. 2017-092233 filed May 8, 2017, the entire content of which is incorporated herein by reference.

BACKGROUND

Field of the Disclosure

The disclosure relates to a rolling magnetic driving unit for causing an optical module to rotate on an axis and to an optical unit with shake correction function that is mounted on an optical element cellular phone or a mobile object.

Description of the Related Documents

Some optical units that are mounted on a mobile object such as a cellular phone, a vehicle or an unmanned helicopter, include a shake correction function, which causes an optical element to swing or rotate in order to correct shake, so as to reduce jitter in a captured image, which is caused by swing of the optical unit. As an above-described optical unit with shake correction function, there has been suggestion of an optical unit that includes: an optical module provided with an optical element; a swing-supporting mechanism for supporting the optical module such that the optical module is able to swing; and a rotation-supporting mechanism for supporting the optical module such that the optical module is able to rotate on an optical axis. The optical unit utilizes a swing magnetic driving mechanism to cause the optical module to swing in a pitching (i.e., vertical swing/tilting) direction and in a yawing (i.e., transvers swing/panning) direction, which are orthogonal to the optical axis, and utilizes a rolling magnetic driving mechanism to cause the optical module to rotate on the optical axis.
[Patent Literature 1]
Japanese Unexamined Patent Application Publication No. 2015-64501

Regarding an optical unit with shake correction function, there exist a case where a shake correction function for causing an optical module to swing and rotate is needed and a case where only a shake correction function for causing an optical module to rotate is needed. Conventionally, for each of the above cases, an optical unit with shake correction function for causing an optical module to swing and rotate and an optical unit with shake correction function for causing an optical module to rotate have been separately developed and manufactured. Hence, standardization of a rolling magnetic driving mechanism, which is required for both types of optical units with shake correction function, has not been achieved, which has resulted in prolongation of development periods and increase in development costs.

In view of the above problem, the object of the at least an embodiment of the disclosure is: to provide a rolling magnetic driving unit that is able to be utilized for both types of an optical unit with shake correction function for causing an optical module to swing and rotate and an optical unit with shake correction function for causing an optical module to rotate; and to provide an optical unit with shake correction function that includes the rolling magnetic driving unit.

SUMMARY

To solve the above problem, a rolling magnetic driving unit of at least an embodiment of the disclosure is a rolling magnetic driving unit that causes an optical module provided with an optical element to rotate on an optical axis of the optical element, the rolling magnetic driving unit including: a rotation-supporting mechanism that includes a rotation seat for supporting the optical module and a bearing mechanism configured to support the rotation seat in such a manner that the rotation seat is able to rotate on a predetermined axis; a fixation member configured to support the optical module via the rotation-supporting mechanism; and a rolling magnetic driving mechanism configured to cause the rotation seat to rotate, wherein the rolling magnetic driving mechanism includes a coil that is fixed to either one of the rotation seat and the fixation member and a magnet that is fixed to the other one of the rotation seat and the fixation member and is opposed to the coil in a direction of the axis.

The rolling magnetic driving unit of at least an embodiment of the disclosure includes a rotation seat for attaching an optical module. Therefore, when an optical module is attached to the rotation seat, an optical unit with shake correction function that causes the optical module to rotate can be configured. Furthermore, when an optical module is attached to the rotation seat via a supporting member that includes a swing-supporting mechanism, an optical unit with shake correction function that causes the optical module to swing and rotate can be configured. Therefore, it is possible to utilize the rolling magnetic driving unit for both of the optical unit with shake correction function that causes the optical module to swing and rotate and the optical unit with shake correction function that causes the optical module to rotate. Furthermore, in at least an embodiment of the disclosure, as a coil and a magnet of the rolling magnetic driving mechanism are opposed to each other in the direction of the axis, it is possible to avoid the rolling magnetic driving unit from becoming large in size in the radial direction.

In at least an embodiment of the disclosure, it is preferable to include an angular-position-recovering mechanism configured to cause the rotation seat to recover to a reference angular position of rotation on the axis. In the above way, it is easy to cause the rotation seat that is rotated to recover to a reference angular position. Therefore, causing the optical module that is attached to the rotation seat to recover to the reference angular position becomes easy.

In at least an embodiment of the disclosure, it is preferable that: the magnet is polarized and magnetized in a circumferential direction; the angular-position-recovering mechanism includes an angular-position-recovering magnetic member that is attached to one of the rotation seat and the fixation member to which the coil is fixed; and, when a state in which the rotation seat is at the reference angular position is seen in the direction of the axis, a center of the angular-position-recovering magnetic member overlaps with a magnetization-polarized line of the magnet. In the above way, in a case where the rotation seat rotates on the axis such that the center of the angular-position-recovering magnetic member moves away from the magnetization-polarized line of the magnet in the circumferential direction, magnetic attractive force in such a direction that forces the center back toward a position that overlaps the magnetization-polarized line is exerted on the angular-position-recovering magnetic member. Therefore, the rotation seat recovers to the reference angular position by use of the magnetic attractive force. Hence, it is possible to cause the rotation seat to recover to the reference angular position without consuming electric power, etc. Furthermore, it is possible to configure an angular-position-recovering mechanism that is smaller in size, compared to a case in which, as an angular-position-recovering mechanism, a plate spring is disposed to bridge over the rotation seat and the fixation member so as to cause the rotation seat to recover to the reference angular position by use of elastic recovering force of the plate spring, which deforms in accordance with rotation of the rotation seat. Furthermore, although a plate spring is deformed or damaged when a relative rotation angle of rotation of the rotation seat and the fixation member is large, the angular-position-recovering magnetic member and the magnet do not have any parts that are mechanically connected. Therefore, it is possible to enlarge the relative rotation angle.

In at least an embodiment of the disclosure, it is preferable that the angular-position-recovering magnetic member is positioned on an opposite side of the magnet with reference to the coil in such a manner that the coil is therebetween in the direction of the axis. In the above way, it is possible that the angular-position-recovering magnetic member functions as a back yoke. Therefore, it is possible to improve the torque of the rolling magnetic driving mechanism to rotate the rotation seat. Furthermore, in the above way, it is possible to ensure a relatively long distance between a magnet and an angular-position-recovering magnetic member. Therefore, it is easy to ensure linearity of magnetic attractive force that is generated between a magnet and an angular-position-recovering magnetic member in accordance with an angle at which the rotation seat rotates.

In at least an embodiment of the disclosure, it is preferable that: a fixation region to which the angular-position-recovering magnetic member is fixed is provided on the one of the rotation seat and the fixation member to which the coil is fixed; and a position to which the angular-position-recovering magnetic member is fixed is changeable inside the fixation region. In the above way, by changing the position to fix the angular-position-recovering magnetic member inside the fixation region, it is possible to define the reference angular position of the rotation seat. Furthermore, by changing the position to fix the angular-position-recovering magnetic member inside the fixation region in the radial direction, it is possible to change an amount of magnetic attractive force (i.e., torque) to be generated between a magnet and an angular-position-recovering magnetic member when the rotation seat rotates.

In at least an embodiment of the disclosure, it is preferable that: the rolling magnetic driving mechanism includes a yoke that is positioned on an opposite side of the coil with reference to the magnet; the fixation member includes a magnet-holding depression part provided on an opposed surface that is opposed to the rotation seat in the direction of the axis and a yoke-holding depression part provided on a non-opposed surface that faces toward an opposite side of the rotation seat in the direction of the axis; the magnet is fixed to the magnet-holding depression part; the yoke is fixed to the yoke-holding depression part; and the coil is fixed to an opposed surface of the rotation seat, the opposed surface of the rotation seat being opposed to the fixation member. In a case where the rolling magnetic driving mechanism includes a yoke, the torque of the rolling magnetic driving mechanism to rotate the rotation seat is improved. Furthermore, in a case where a magnet and a yoke are fixed inside depression parts (i.e., a magnet-holding depression part and a yoke-holding depression part) that are provided in the fixation member, it is possible to avoid the magnet and the yoke from protruding from the fixation member. Therefore, handling of the rolling magnetic driving unit becomes easy. Furthermore, in a case where a coil is fixed to the opposed surface of the rotation seat that is opposed to the fixation member, it is possible to avoid the coil from protruding toward the outer circumferential side of the fixation member and the rotation seat. Therefore, handling of the rolling magnetic driving unit becomes easy.

In at least an embodiment of the disclosure, in order to define a rotation-angle range of rotation by the rotation seat, it is preferable to include a rotation-angle-range-restraining mechanism configured to define a rotation-angle range of the rotation seat, and it is preferable that the rotation-angle-range-restraining mechanism includes a protrusion part protruding from either one of the rotation seat and the fixation member toward the other one of the rotation seat and the fixation member and an abutting part provided on the other one of the rotation seat and the fixation member in such a manner that the abutting part is able to abut against the protrusion part from a circumferential direction.

In at least an embodiment of the disclosure, in order to support the rotation seat by the fixation member such that the rotation seat is able to rotate, it is possible that: the rotation seat includes a seat main body and a shaft part extending from the seat main body toward the fixation member in the direction of the axis; the bearing mechanism includes a ball bearing that is attached to an outer circumferential side of the shaft part; and the fixation part includes a holding part in a cylindrical shape that is configured to hold the ball bearing from the outer circumferential side and a pressure-imposing mechanism configured to impose a pressure in the direction of the axis on the ball bearing from an opposite side of the rotation seat.

In at least an embodiment of the disclosure, it is possible that: the bearing mechanism includes a second ball bearing that is attached on the outer circumferential side of the shaft part in such a manner that the second ball bearing is coaxial with the ball bearing; the second ball bearing is positioned on a side closer to the rotation seat, compared to the ball bearing; the holding part holds the ball bearing and the second ball bearing from the outer circumferential side; and the pressure-imposing mechanism imposes the pressure on the second ball bearing via the ball bearing. In a case where the shaft part of the rotation seat is supported with two ball bearings that are aligned in the direction of the axis, it is possible to avoid the shaft part from tilting relative to the axis. Therefore, it is possible to prevent the rotation seat from swinging while rotating.

In at least an embodiment of the disclosure, it is possible that: the bearing mechanism includes a plurality of roll-moving members that are provided on the outer circumferential side of the ball bearing and arranged between the rotation seat and the fixation member in the direction of the axis; and the pressure-imposing mechanism imposes the pressure via the ball bearing in such a direction that pushes the fixation member toward the seat main body. In a case where the shaft part of the rotation seat is held with the ball bearing and the seat main body of the rotation seat is supported by the fixation member via the roll-moving members, it is possible to avoid the rotation seat from tilting relative to the axis. Therefore, it is possible to prevent the rotation seat from swinging while rotating. Furthermore, in a case where a pressure in such a direction that forces the fixation member toward the seat main body is imposed by the pressure-imposing mechanism, it is possible to avoid the fixation member and the seat main body from being separated. Therefore, it is possible to avoid the roll-moving members from falling off the space between the fixation member and the seat main member.

In at least an embodiment of the disclosure, it is preferable that: the rotation seat includes a seat-side opposed part that is around the axis and is opposed to the fixation member; the fixation member includes a fixation-member-side opposed part that is opposed to the seat-side opposed part in the direction of the axis; the seat-side opposed part includes a seat-side annular groove enclosing the axis; the fixation-member-side opposed part includes a fixation-member-side annular groove that is opposed to the seat-side annular groove; and the plurality of roll-moving members are inserted in the seat-side annular groove and the fixation-member-side annular groove. In the above way, behavior of the roll-moving members become consistent because the roll-moving members move in a rolling manner in the seat-side annular groove and the fixation-member-side annular groove. Therefore, rotation of the rotation seat becomes stable.

In at least an embodiment of the disclosure, it is preferable that: the bearing mechanism includes a retainer in an annular shape enclosing the axis between the seat-side opposed part and the fixation-member-side opposed part; the retainer includes a plurality of through holes arranged in a circumferential direction; and the plurality of roll-moving members are inserted to the plurality of through holes, respectively. In the above way, behavior of the roll-moving members become consistent because the roll-moving members move in a rolling manner inside the through holes of the retainer. Therefore, rotation of the rotation seat becomes stable.

In at least an embodiment of the disclosure, it is preferable that: the retainer includes, between two of the plurality of through holes that are adjacent to each other in the circumferential direction, a first projection part that protrudes toward the seat-side opposed part, and a second projection part that protrudes toward the fixation-member-side opposed part; the first projection part is able to make contact in a sliding manner with an edge portion of the seat-side annular groove provided on the seat-side opposed part; and the second projection part is able to make contact in a sliding manner with an edge portion of the fixation-member-side annular groove provided on the fixation-member-side opposed part. In the above way, the posture of the retainer is stable.

In at least an embodiment of the disclosure, it is possible that the retainer includes cutout parts at two distant locations on an outer circumferential edge. In the above way, by holding the retainer by use of jigs, etc., via the cutout parts, it is possible to determine a posture (i.e., an angular position) of the retainer at the periphery of the axis. Therefore, arrangement of the roll-moving members such as balls in the through holes of the retainer when manufacturing a device, etc., becomes easy.

In at least an embodiment of the disclosure, it is preferable to include a cover member that is provided on an opposite side of the fixation member with reference to the rotation seat and is configured to cover the yoke in the direction of the axis from a position apart from the yoke, and it is preferable that: a flexible printed circuit board is connected to the coil; and the flexible printed circuit board is drawn between the yoke and the cover member. In the above way, it is possible to protect the yoke. Furthermore, in the above way, it is possible to prevent the flexible printed circuit board from being unstable when handling the rolling magnetic driving unit.

In at least an embodiment of the disclosure, it is preferable that the rotation seat includes a position-determining part for fixing the optical module while making the optical axis and the axis corresponding to each other. In the above way, fixation of the optical module to the rotation seat becomes easy.

Next, an optical unit with shake correction function of at least an embodiment of the disclosure includes: the above-described rolling magnetic driving unit; and an optical unit with shake correction function that is provided with the optical module, a swing-supporting mechanism configured to support the optical module in such a manner that the optical module is able to swing, a supporting member configured to support the optical module via the swing-supporting mechanism, and a swing magnetic driving mechanism configured to cause the optical module to swing, wherein the optical module is attached to the rotation seat via the supporting member.

Furthermore, an optical unit with shake correction function of another embodiment of the disclosure includes: the above-described rolling magnetic driving unit; and the optical module, wherein the optical module is attached to the rotation seat.

According to at least an embodiment of the disclosure, shared use of a rolling magnetic driving mechanism for an optical unit with shake correction function that causes an optical module to rotate and for an optical unit with shake correction function that causes an optical module to swing and rotate is possible.

BRIEF DESCRIPTION OF THE DRAWINGS

Embodiments will now be described, by way of example only, with reference to the accompanying drawings which are meant to be exemplary, not limiting, and wherein like elements are numbered alike in several Figures, in which.

DETAILED DESCRIPTION

The following description explains an embodiment of an optical unit including a rolling magnetic driving unit, to which the at least an embodiment of the disclosure is applied, with reference to drawings. In the present specification, directions of three axes X, Y and Z are orthogonal to each other. Further, one side of the X-axis direction is indicated by +X and the other side is indicated by −X. Further, one side of the Y-axis direction is indicated by +Y and the other side is indicated by −Y. Further, one side of the Z-axis direction is indicated by +Z and the other side is indicated by −Z. The Z-axis direction is an axis direction of the optical unit and is also an optical-axis direction of an optical element. The +Z direction is the object side of the optical unit and the −Z direction is the counter-object side (i.e., the image side) of the optical unit.

(Overall Configuration)

Figure 1:
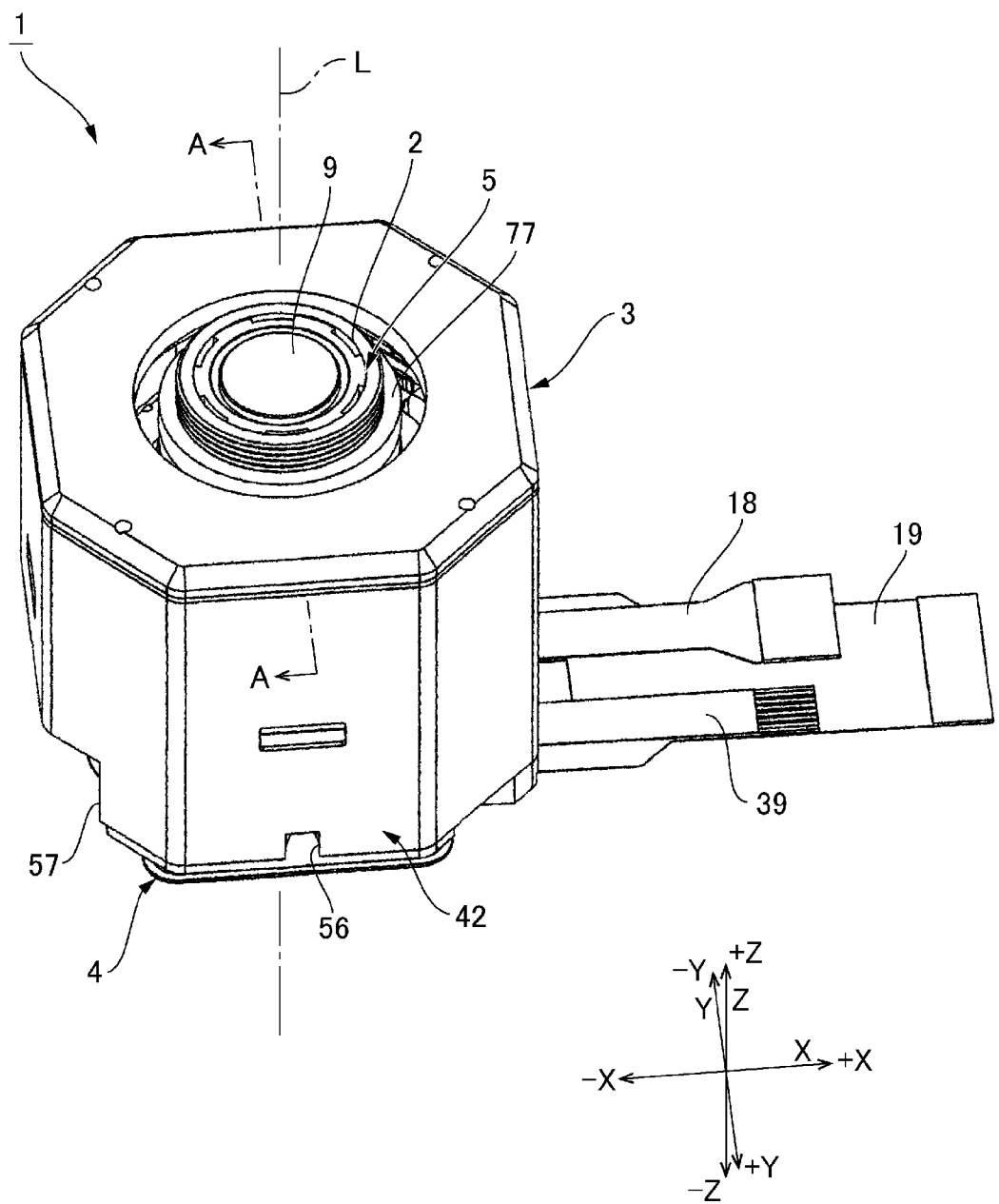
FIG. 1 is a perspective view of an optical unit to which at least an embodiment of the disclosure is applied, in which the optical unit is seen from an object side.
Figure 2:
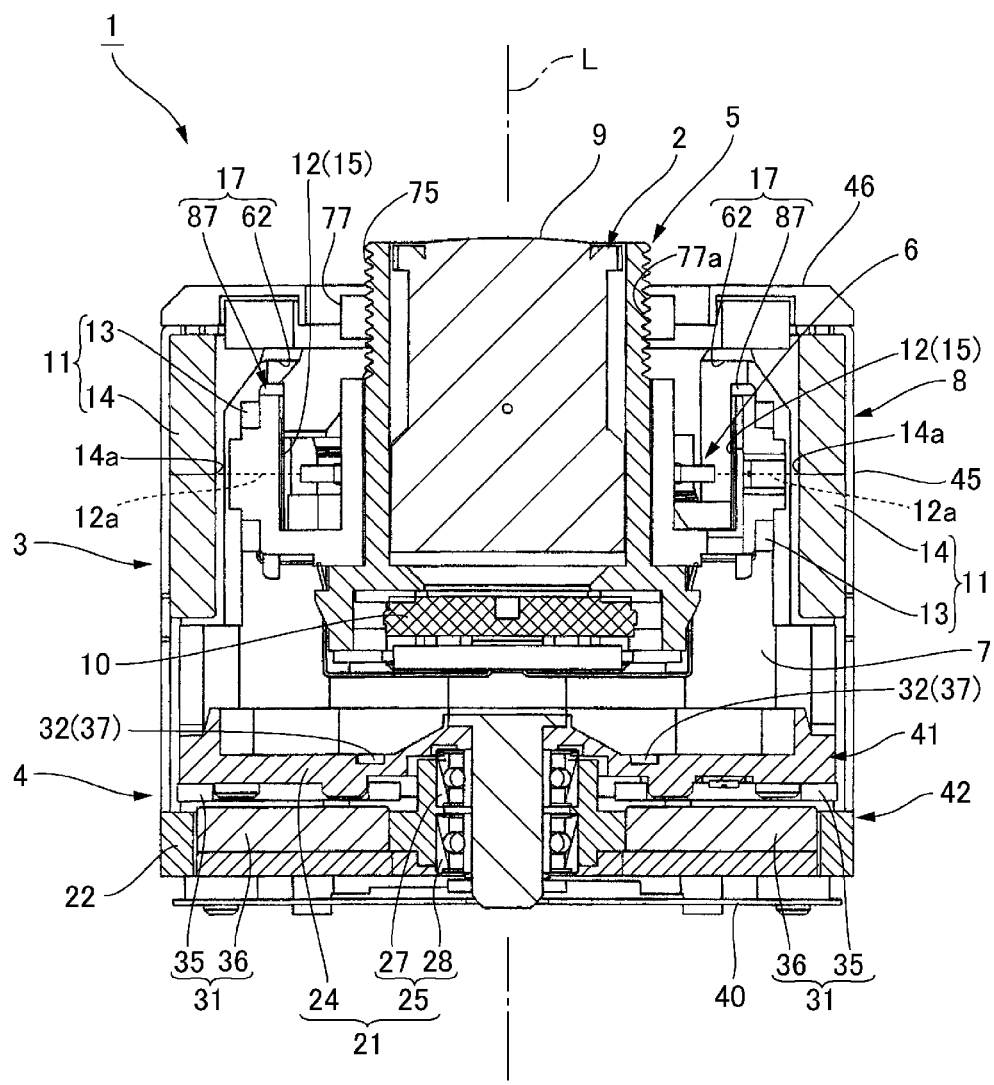
FIG. 2 is a cross-sectional view of the optical unit taken along the line A-A of FIG. 1.
Figure 3:
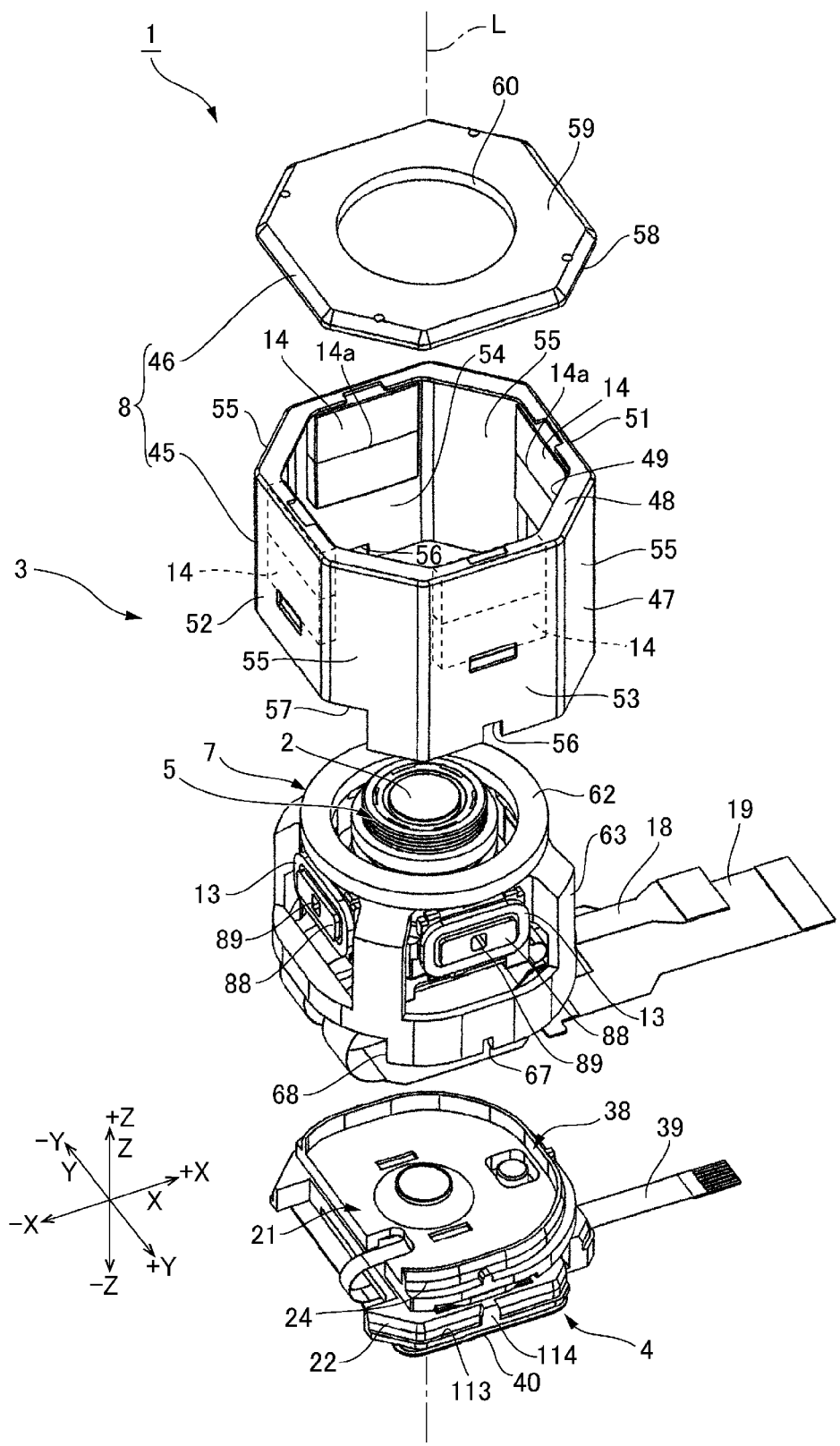
FIG. 3 is an exploded perspective view of the optical unit of FIG. 1, in which the optical unit is seen from the object side.

FIG. 1 is a perspective view of the optical unit to which at least an embodiment of the disclosure is applied, in which the optical unit is seen from the object side. FIG. 2 is a cross-sectional view of the optical unit taken along the line A-A of FIG. 1. FIG. 3 is an exploded perspective view of the optical unit of FIG. 1, in which the optical unit is seen from the object side. For example, the optical unit 1 illustrated in FIG. 1 is utilized for an optical device such as a cellular phone device with camera or a drive recorder, or for an optical device such as an action camera or a wearable camera mounted on a mobile object such as a helmet, a bicycle or a radio control helicopter. Regarding such an optical device, shake of the optical device when capturing an image causes occurrence of jitter in the captured image. The optical unit 1 in the present embodiment is an optical unit with shake correction function for correcting tilt and rotation of a mounted optical module 2, so as to avoid jitter in a captured image.

As illustrated in FIG. 2 and FIG. 3, the optical unit 1 includes: a first unit 3 (i.e., an optical unit with swing function) that is provided with the optical module 2; and a second unit 4 (i.e., a rolling magnetic driving unit) that supports the first unit 3 from the −Z-direction side such the first unit 3 is able to rotate.

As illustrated in FIG. 2, the first unit 3 includes: a movable unit 5 that is provided with the optical module 2; a swing-supporting mechanism 6 that supports the movable unit 5 such that the movable unit 5 is able to swing; a holder 7 (i.e., a supporting member) that supports the movable unit 5 via the swing-supporting mechanism 6; and a casing member 8 that encloses the movable unit 5 and the holder 7 from the outer circumferential side. The optical module 2 includes: an optical element 9; and an imaging element 10 that is arranged on the optical axis of the optical element 9. The swing-supporting mechanism 6 supports the movable unit 5 such that the movable unit 5 is able to swing in a range between a reference posture, in which a predetermined axis L corresponds to the optical axis of the optical element 9, and a tilting posture, in which the optical axis tilts relative to the axis L. The swing-supporting mechanism 6 has a gimbal mechanism. Here, the axis L corresponds to the Z-axis direction.

Furthermore, the first unit 3 includes: a swing magnetic driving mechanism 11 that causes the movable unit 5 to swing; and a posture-recovering mechanism 12 that causes the movable unit 5, which swings, to recover to the reference posture. The swing magnetic driving mechanism 11 includes: a swing driving coil 13 that is held by the movable unit 5; and a swing driving magnet 14 that is held by the casing member 8. The swing driving coil 13 and the swing driving magnet 14 are opposed to each other in the radial direction that is orthogonal to the axis L. The posture-recovering mechanism 12 includes a posture-recovering magnetic member 15 that is held by the movable unit 5 such that the posture-recovering magnetic member 15 is opposed to the swing driving magnet 14.

Furthermore, the first unit 3 includes a swing-stopper mechanism 17 that restrains a swing range of the movable unit 5. Furthermore, the first unit 3 includes: a flexible printed circuit board 18 that is electronically connected to the swing driving coil 13; and a flexible printed circuit board 19 that is electronically connected to the imaging element 10.

Next, the second unit 4 includes: a rotation-supporting mechanism 21 that supports the holder 7 such that the holder 7 is able to rotate on the axis L; and a fixation member 22 that supports the holder 7 via the rotation-supporting mechanism 21. The rotation-supporting mechanism 21 includes a rotation seat 24 and a bearing mechanism 25. The rotation seat 24 is supported by the fixation member 22 via the bearing mechanism 25 such that the rotation seat 24 is able to rotate. The bearing mechanism 25 includes a first ball bearing 27 and a second ball bearing 28, which are aligned in the Z-axis direction. The first ball bearing 27 is positioned in the +Z direction relative to the second ball bearing 28.

Furthermore, the second unit 4 includes: a rolling magnetic driving mechanism 31 that causes the rotation seat 24 to rotate; and an angular-position-recovering mechanism 32 for causing the rotation seat 24, which has rotated, to recover to a predetermined reference angular position. The rolling magnetic driving mechanism 31 includes: a rolling driving coil 35 that is held by the rotation seat 24; and a rolling driving magnet 36 that is held by the fixation member 22. The rolling driving coil 35 and the rolling driving magnet 36 are opposed to each other in the Z-axis direction. The angular-position-recovering mechanism 32 includes an angular-position-recovering magnetic member 37 that is fixed to the rotation seat 24. The angular-position-recovering magnetic member 37 overlaps the rolling driving magnet 36 when the angular-position-recovering magnetic member 37 is seen in the Z-axis direction. Furthermore, the second unit 4 includes a rotation-stopper mechanism 38 (i.e., a rotation-angle-range-restraining mechanism) that restrains a rotation-angle range of the rotation seat 24. Additionally, the second unit 4 includes: a flexible printed circuit board 39 that is electronically connected to the rolling driving coil 35; and a cover member 40 that is fixed to the fixation member 22.

Here, to the rotation seat 24, the holder 7 of the first unit 3 is attached. Accordingly, when the rotation seat 24 rotates, the movable unit 5 and the holder 7 of the first unit 3 rotates on the Z-axis direction (i.e., on the axis L) integrally with the rotation seat 24. That is to say, the movable unit 5 and the holder 7 of the first unit 3 and the rotation seat 24 of the second unit 4 configure a movable member 41 that integrally rotates on the Z-axis direction. Contrarily, to the fixation member 22, the casing member 8 of the first unit 3 is attached. Accordingly, the fixation member 22 and the casing member 8 configure a fixation member 42 that supports the movable member 41 such that the movable member 41 is able to rotate. The rotation seat 24 configures the movable member 41 as well as the rotation-supporting mechanism 21.

(First Unit)

As illustrated in FIG. 3, the casing member 8 includes: a cylindrical casing 45 whose external shape is substantially octagonal when the cylindrical casing 45 is seen in the Z-axis direction; an object-side casing 46 that is attached to the cylindrical casing 45 from the +Z-direction side (i.e., the object side). The cylindrical casing 45 is formed of magnetic material. The object-side casing 46 is formed of resin material.

The cylindrical casing 45 includes: a body part 47 that is in cylindrical and substantially octagonal shape; and an end-plate part 48 that is in a shape of a frame extending internally from the +Z-direction-edge-part of the body part 47. At the center of the end-plate part 48, there is formed an opening part 49 that is in a substantially octagonal shape. The body part 47 includes: side-plates 51 and 52 that are opposed to each other in the X-axis direction; side-plates 53 and 54 that are opposed to each other in the Y-axis direction; and side-plates 55 that are provided at four corner-parts, each of which faces diagonally at 45 degrees relative to the X-axis direction and the Y-axis direction. Swing driving magnets 14 are respectively fixed to the inner circumferential surfaces of the side-plates 51 and 52, which are opposed to each other in the X-axis direction, and of the side-plates 53 and 54, which are opposed to each other in the Y-axis direction. Each of the swing driving magnets 14 is polarized and magnetized in the Z-axis direction. The magnetization-polarized line 14*a* of each swing driving magnet 14 extends in a direction orthogonal to the Z-axis (i.e., the axis L) in the circumferential direction.

Furthermore, the cylindrical casing 45 includes position-determining cutout parts 56 respectively at a bottom end-edge portion in the +X direction, a bottom end-edge portion in the +Y direction, and a bottom end-edge portion in the −Y direction. Furthermore, the body part 47 includes, at a bottom end-edge portion in the −X direction, a cutout part 57 in a rectangular shape for drawing the flexible printed circuit boards 18 and 19.

The object-side casing 46 includes: a body part 58 that is in a cylindrical shape and abuts against the end-plate part 48 of the cylindrical casing 45; and an end-plate part 59 that extends internally from the +Z-direction-edge-part of the body part 58. At the center of the end-plate part 59, there is formed a circular opening part 60. Through the circular opening part 60, the +Z-direction-end-portion of the optical module 2 is inserted.

(Holder)

Figure 4:
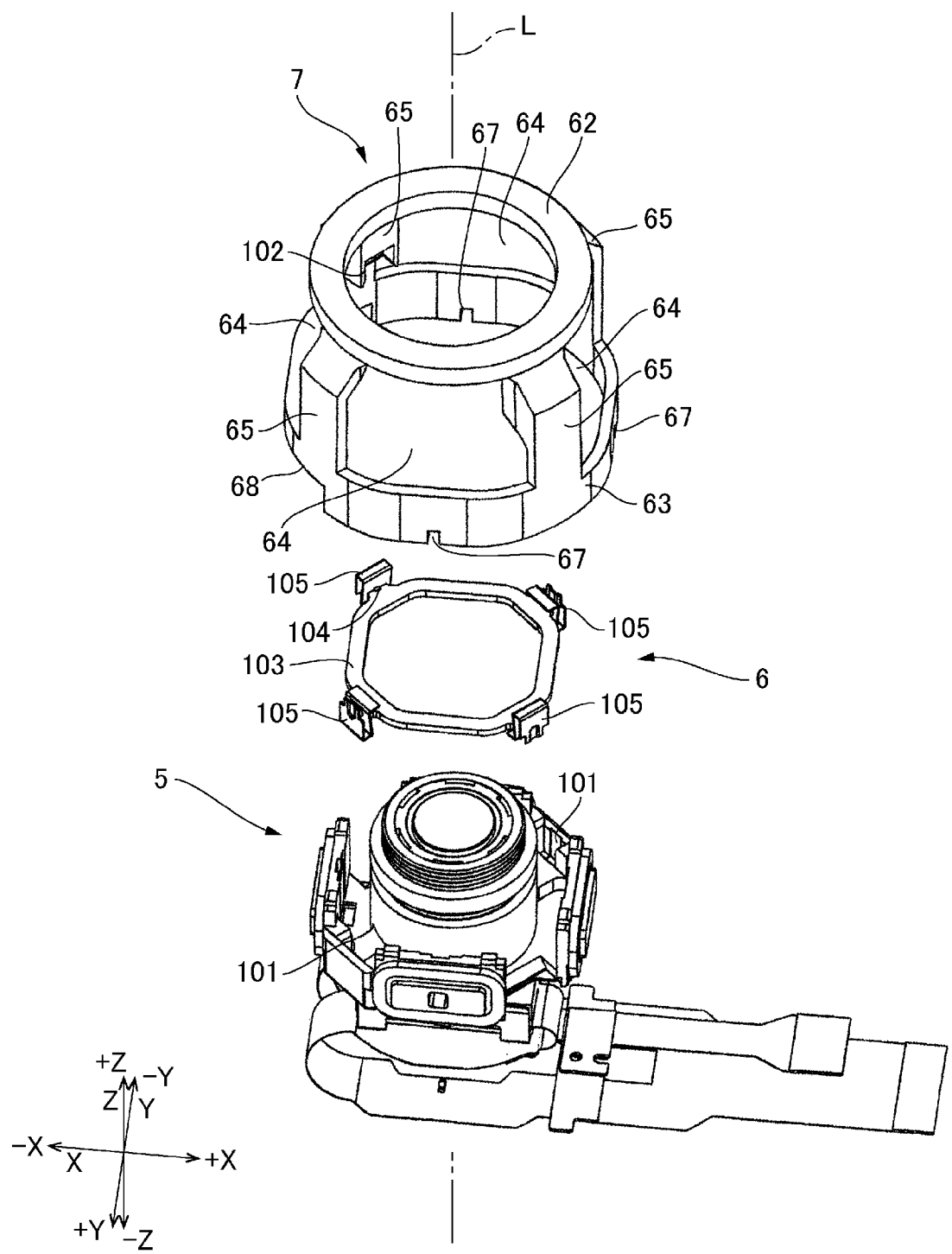
FIG. 4 is an exploded perspective view of a first unit, in which the first unit is seen from the object side.
Figure 5:
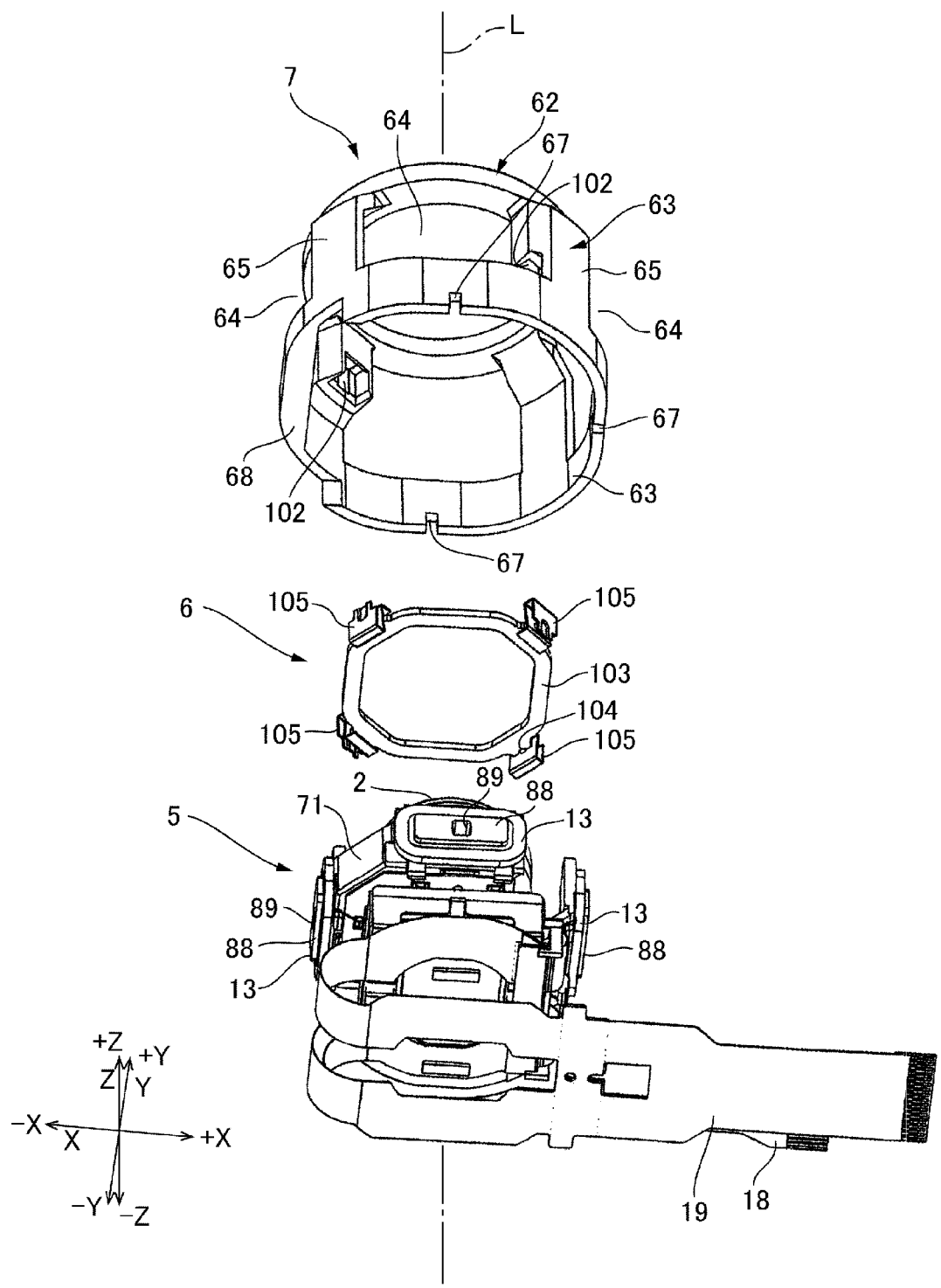
FIG. 5 is an exploded perspective view of the first unit, in which the first unit is seen from a counter-object side.

FIG. 4 is an exploded perspective view of the movable unit 5 and the holder 7, in which the movable unit 5 and the holder 7 are seen from the +Z-direction side. FIG. 5 is an exploded perspective view of the movable unit 5 and the holder 7, in which the movable unit 5 and the holder 7 are seen from the −Z-direction side. As illustrated in FIG. 4, the holder 7 includes: a holder annular part 62 through which the +Z-direction-end-portion of the movable unit 5 is inserted; and a holder body part 63 that is continuous toward the −Z-direction side of the holder annular part 62. The holder body part 63 includes: four window parts 64 that are aligned in the circumferential direction; and four longitudinal frame parts 65 that partition to create the window parts 64 arranged side by side in the circumferential direction. Two of the four window parts 64 are open in the X-axis direction, and the other two are open in the Y-axis direction. The four longitudinal frame parts 65 are positioned at angles between the X-axis direction and the Y-axis direction, respectively.

The holder body part 63 includes position-determining cutout parts 67 respectively at a bottom end-edge portion in the +X direction, a bottom end-edge portion in the +Y direction, and a bottom end-edge portion in the −Y direction. Furthermore, the holder body part 63 includes, at a bottom end-edge portion in the −X direction, a cutout part 68 that is in a rectangular shape for drawing the flexible printed circuit boards 18 and 19.

(Movable Unit)

Figure 6:
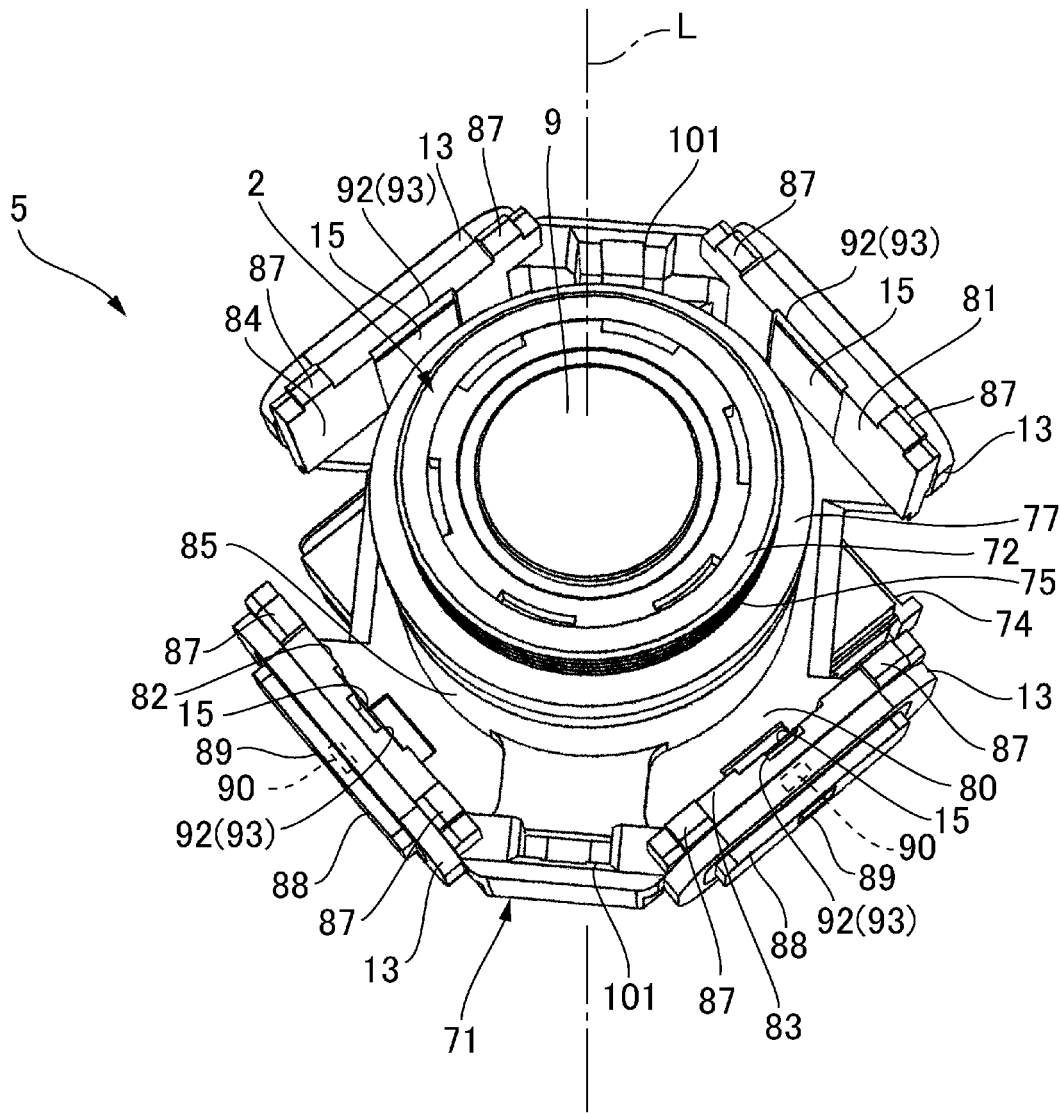
FIG. 6 is a perspective view of a movable member, in which the movable member is seen from the object side.
Figure 7A:
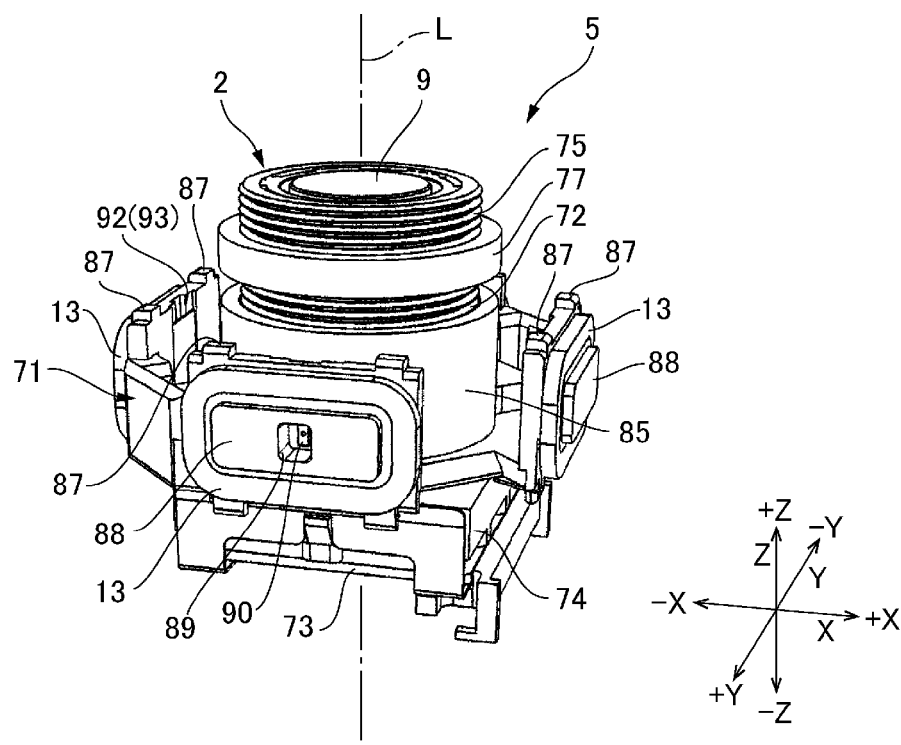
FIG. 7A is a perspective view of the movable member, in which the movable member s seen from the object side.
Figure 7B:
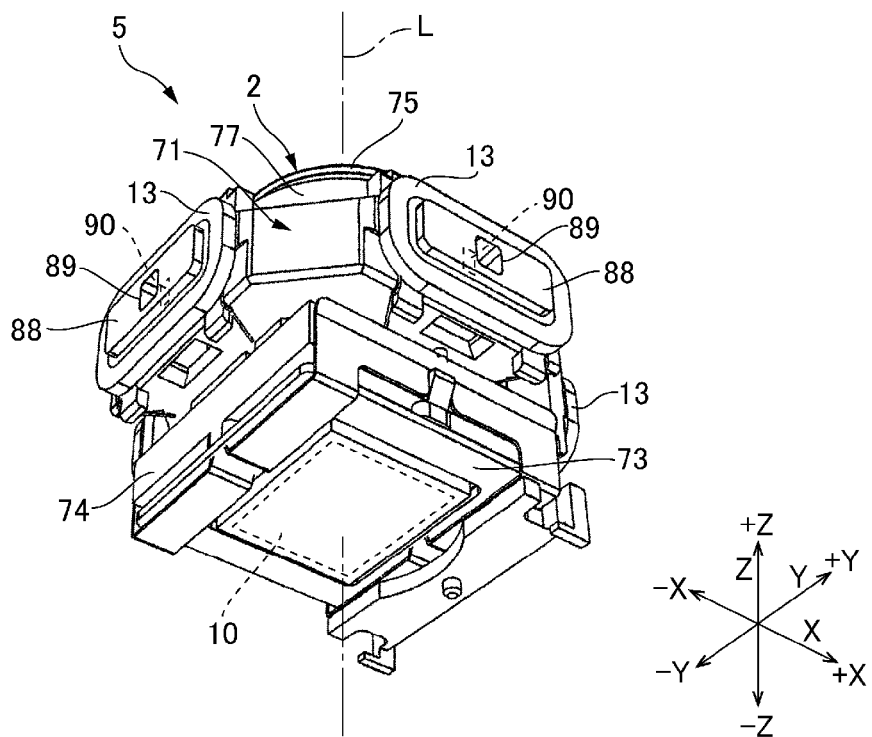
FIG. 7B is a perspective view of the movable member, in which the movable member is seen from the counter-object side.

FIG. 6 is a perspective view of the movable unit 5, in which the movable unit 5 is seen from the +Z-direction side (i.e., the object side). FIG. 7A is a perspective view of the movable unit 5, in which the movable unit 5 is seen from the +Z-direction side (i.e., the object side), and FIG. 7B is a perspective view of the movable unit 5, in which the movable unit 5 is seen from the −Z-direction side. As illustrated in FIG. 6 and FIGS. 7A and 7B, the movable unit 5 includes: the optical module 2; and an optical module holder 71 that holds the optical module 2 from the outer circumferential side. The optical module 2 includes: a mirror cylinder part 72 that holds the optical element 9 on the inner circumferential side; and a square tube part 74 that holds a circuit board 73 on the inner circumferential side at the −Z-direction-end-portion of the mirror cylinder part 72. On the circuit board 73, the imaging element 10 is mounted. On the outer circumferential surface of the +Z-direction-end-portion of the mirror cylinder part 72, there is provided a male screw part 75 in a region having a predetermined width in the Z-axis direction.

To the male screw part 75, there is attached a weight 77 for adjusting the barycentric position of the movable unit 5. The weight 77 is in an annular shape and includes, on the inner circumferential surface, a female screw part 77*a* that is able to be screw-connected with the male screw part 75 (c.f., FIG. 2). Here, the male screw part 75 is a fixation region for fixing the weight 77. By rotating the weight 77 on the Z-axis, the position of the weight 77 is moved in the Z-axis direction inside the fixation region, such that the barycentric position of the movable unit 5 is adjusted in the Z-axis direction.

As illustrated in FIG. 6, the optical module holder 71 includes: a bottom plate part 80 that is in a substantially octagonal shape when the bottom plate part 80 is seen in the Z-axis direction; a pair of wall parts 81 and 82 that rise in the +Z direction from the both X-axis-direction-ends of the bottom plate part 80 and extend in the Y-axis direction, respectively; and a pair of wall parts 83 and 84 that rise in the +Z direction from the both Y-axis-direction-ends of the bottom plate part 80 and extend in the X-axis direction, respectively. Furthermore, the optical module holder 71 includes an optical module holding part 85 that is provided at the center of the bottom plate part 80. The optical module holding part 85 is in a cylindrical shape and is coaxial with the axis L. Through the optical module holding part 85, the mirror cylinder part 72 of the optical module 2 is inserted. The optical module holding part 85 holds the mirror cylinder part 72 from the outer circumferential side. On the +Z-direction-end-surface of each wall part 81, 82, 83, and 84, there are provided two swing-stopper projection parts 87 that protrudes in the +Z direction. The two swing-stopper projection parts 87 respectively protrude from both of the circumferential-direction-end-portions of each wall part 81, 82, 83, and 84.

On the outside-surface of each wall part 81, 82, 83, and 84, which faces outward in the radial direction, there is provided a coil fixation part 88. To each coil fixation part 88, a swing driving coil 13 is fixed such that the central hole of the swing driving coil 13 faces outward in the radial direction. Furthermore, in the coil fixation parts 88 of the wall part 82, which is positioned on the −X-direction side, and of the wall part 83, which is positioned on the +Y-direction side, there are provided Hall element fixation parts 89, respectively. To each Hall element fixation part 89, a Hall element 90 is fixed. A Hall element 90 is positioned at the center of each swing driving coil 13 with respect to the Z-axis direction. A Hall element 90 is electronically connected to the flexible printed circuit board 18.

On the inside-surface of each wall part 81, 82, 83, and 84, which faces inward in the radial direction, there is provided a fixation region 92 to which a posture-recovering magnetic member 15 is fixed. A fixation region 92 is a groove 93 having a predetermined width, which extends in the Z-axis direction on the inside-surface. A posture-recovering magnetic member 15 is in a shape of a rectangular plate whose dimension of the Z-axis direction is longer than the dimension of the circumferential direction. Furthermore, the dimension of Z-axis direction of the posture-recovering magnetic member 15 is shorter than the dimension of the Z-axis direction of the groove 93. The posture-recovering magnetic member 15 is fixed inside the groove 93 (i.e., inside the fixation region 92) such that the longitudinal direction of the posture-recovering magnetic member 15 is oriented in the Z-axis direction. Here, the position to fix the posture-recovering magnetic member 15 is adjusted in the Z-axis direction inside the groove 93 (i.e., inside the fixation region 92), and then the posture-recovering magnetic member 15 is fixed inside the groove 93 (i.e., inside the fixation region 92) by use of an adhesive agent, such that, when the movable unit 5 being in the reference posture is seen in the radial direction, the center of the posture-recovering magnetic member 15 is at such a position that overlaps with the magnetization-polarized line 14a of the swing driving magnet 14.

(Swing-Supporting Mechanism)

Figure 8:
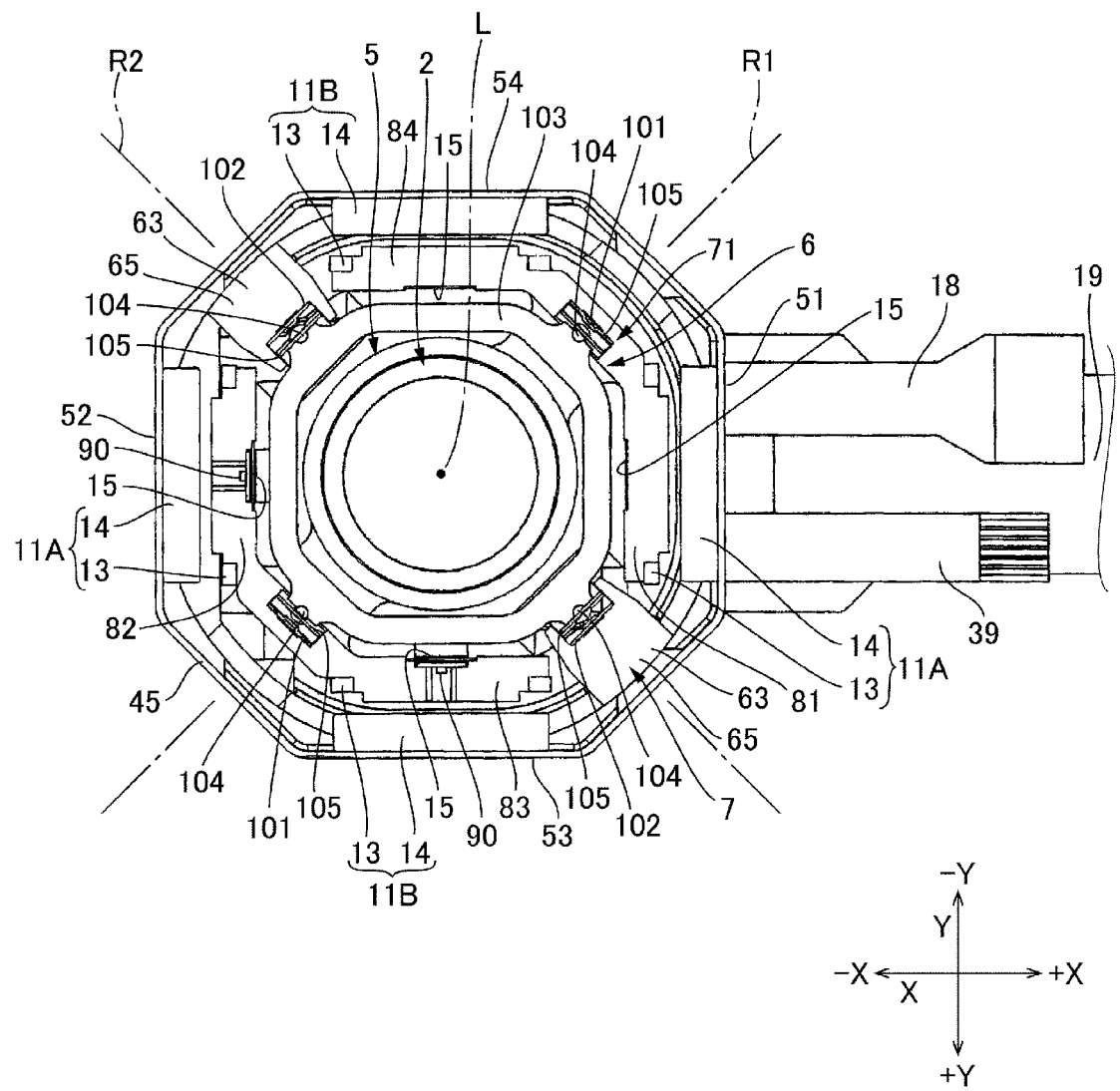
FIG. 8 is a cross-sectional view of the optical unit taken along a plane that is orthogonal to an axis.

FIG. 8 is a cross-sectional view of the optical unit 1 taken along a plane that is orthogonal to the Z-axis (i.e., the axis L) and passes through the swing-supporting mechanism 6. The swing-supporting mechanism 6 is configured between the optical module holder 71 and the holder 7. As illustrated in FIG. 8, the swing-supporting mechanism 6 includes: two first swing-supporting parts 101 that are provided on the camera module holder 71 at diagonal positions on a first axis R1; two second swing-supporting parts 102 that are provided on the holder body part 63 at diagonal positions on a second axis R2; and a movable frame 103 that is supported by the first swing-supporting parts 101 and the second swing-supporting parts 102. Here, the first axis R1 and the second axis R2 are in respective directions that are orthogonal to the Z-axis direction and face diagonally at 45 degrees relative to the X-axis direction and the Y-axis direction. Therefore, the first swing-supporting parts 101 and the second swing-supporting parts 102 are arranged in respective angular positions that are between the X-axis direction and the Y-axis direction. As illustrated in FIG. 4 and FIG. 5, the second swing-supporting parts 102 are depression parts that are formed on the inside-surface of the holder body part 63.

As illustrated in FIG. 8, the movable frame 103 is a plate-shaped spring whose planar shape is substantially octagonal when the movable frame 103 is seen in the Z-axis direction. On the outside-surface of the movable frame 103, metallic balls 104 are fixed by way of welding, etc., at four positions around the Z-axis. The balls 104 respectively make point-contact with contact springs 105 that are held by the first swing-supporting parts 101, which are provided on the camera module holder 71, and by the second swing-supporting parts 102, which are provided on the holder body part 63. As illustrated in FIG. 4 and FIG. 5, the contact springs 105 are plate-shaped springs. Further, the contact springs 105 held by the first swing-supporting parts 101 are elastically deformable in the first axis R1 direction, and the contact springs 105 held by the second swing-supporting parts 102 are elastically deformable in the second axis R2 direction. Therefore, the movable frame 103 is supported such that the movable frame 103 is able to rotate on each of the two directions (i.e., the first axis R1 direction and the second axis R2 direction), which are orthogonal to the Z-axis direction.

(Swing Magnetic Driving Mechanism)

As illustrated in FIG. 8, the swing magnetic driving mechanism 11 includes a first swing magnetic driving mechanism 11A and a second swing magnetic driving mechanism 11B, which are provided between the movable unit 5 and the cylindrical casing 45. The first swing magnetic driving mechanism 11A includes two pairs of a swing driving magnet 14 and a swing driving coil 13, which are opposed to each other in the X-axis direction. Furthermore, the first swing magnetic driving mechanism 11A includes a Hall element 90 that are arranged on the inside of the swing driving coil 13 of the pair on the −X-direction side. The second swing magnetic driving mechanism 11B includes two pairs of a swing driving magnet 14 and a swing driving coil 13, which are opposed to each other in the Y-axis direction. Furthermore, the second swing magnetic driving mechanism 11B includes a Hall element 90 that are arranged on the inside of the swing driving coil 13 of the pair on the +Y-direction side.

The swing driving coils 13 are respectively held on the outside-surfaces of the wall parts 81 and 82, which are on both of the X-axis-direction-sides of the camera module holder 71, and on the outside-surfaces of the wall parts 83 and 84, which are on both of the Y-axis-direction-sides of the camera module holder 71. The swing driving magnets 14 are held on the inside-surfaces of the side-plates 51, 52, 53, and 54, which are provided on the cylindrical casing 45 of the casing member 8. As illustrated in FIG. 2 and FIG. 3, each of the swing driving magnets 14 is separated with respect to the Z-axis direction and is magnetized such that the magnetic poles on the inside-surfaces are different with reference to a magnetization-polarized line 14a. As for the swing driving coils 13, the long edge portions on the +Z-direction side and on the −Z-direction side are utilized as effective edges. When the movable unit 5 is in the reference posture, each Hall element 90 is opposed to the magnetization-polarized line 14a of a swing driving magnet 14, which is positioned on the outer circumferential side. Here, the cylindrical casing 45 is made of magnetic material, and therefore the cylindrical casing 45 functions as a yoke for the swing driving magnets 14.

The two pairs of the second swing magnetic driving mechanisms 11B, which are positioned on the +Y-direction side and on the −Y-direction side of the movable unit 5, are connected by wiring such that magnetic driving force is generated in the same direction at the periphery of the X-axis when power is supplied to the swing driving coils 13. Furthermore, the two pairs of the first swing magnetic driving mechanisms 11A, which are positioned on the +X-direction side and on the −X-direction side of the movable unit 5, are connected by wiring such that magnetic driving force is generated in the same direction at the periphery of the Y-axis when power is supplied to the swing driving coils 13. The swing magnetic driving mechanism 11 causes the optical module 2 to rotate on the first axis R1 and on the second axis R2, by way of synthesizing rotation on the X-axis, which is caused by the second swing magnetic driving mechanisms 11B, and rotation on the Y-axis, which is caused by the first swing magnetic driving mechanisms 11A. In a case of performing shake correction on the X-axis and shake correction on the Y-axis, one rotation on the first axis R1 and two rotations of the second axis R2 are synthesized.

(Swing-Stopper Mechanism)

As illustrated in FIG. 2, the swing-stopper mechanism 17 for restraining the swing range of the movable unit 5 is configured with: the swing-stopper projection parts 87 that are provided on the movable unit 5 (i.e., the optical module holder 71); and the holder annular part 62. In a case where the movable unit 5 is in such a tilting posture that exceeds a predetermined swing range of the movable unit 5, the swing-stopper projection parts 87 abut against the holder annular part 62 so as to restrain the movable unit 5 from tilting further. Furthermore, as for the swing-stopper mechanism 17, in a case where the movable unit 5 is moved in the +Z direction by external force, the swing-stopper projection parts 87 abut against the holder annular part 62 so as to restrain the movable unit 5 from moving further in the +Z direction.

(Posture-Recovering Mechanism)

The posture-recovering mechanism 12 includes a posture-recovering magnetic member 15 and a swing driving magnet 14. As illustrated in FIG. 2, a posture-recovering magnetic member 15 is arranged on the opposite side of a swing driving magnet 14 with reference to a swing driving coil 13 such that the swing driving coil 13 is therebetween in the radial direction. When the holder 7 being in the reference posture is seen in the radial direction, the center of the posture-recovering magnetic member 15 is at such a position that overlaps a magnetization-polarized line 14a of a swing driving magnet 14, which is positioned on the outer circumferential side. In other words, when the movable unit 5 is in the reference posture, a virtual surface 12a (c.f., FIG. 2) that includes a magnetization-polarized line 14a and is orthogonal to the axis L would pass through the center of a posture-recovering magnetic member 15.

Here, when the movable unit 5 tilts from the reference posture (i.e., when the optical axis of the optical module 2 tilts relative to the axis L), the center of the posture-recovering magnetic member 15 moves away in the Z-axis direction from the magnetization-polarized line 14a of a swing driving magnet 14. Hence, between a posture-recovering magnetic member 15 and a swing driving magnet 14, magnetic attractive force is exerted in such a direction that the center of the posture-recovering magnetic member 15 is forced toward the side where there is the magnetization-polarized line 14a of the swing driving magnet 14. That is to say, when the movable unit 5 tilts from the reference posture, magnetic attractive force that causes the movable unit 5 to recover to the reference posture is exerted between a posture-recovering magnetic member 15 and a swing driving magnet 14. Accordingly, a posture-recovering magnetic member 15 and a swing driving magnet 14 function as a posture-recovering mechanism that causes the movable unit 5 to recover to the reference posture.

(Second Unit)

Figure 9A:
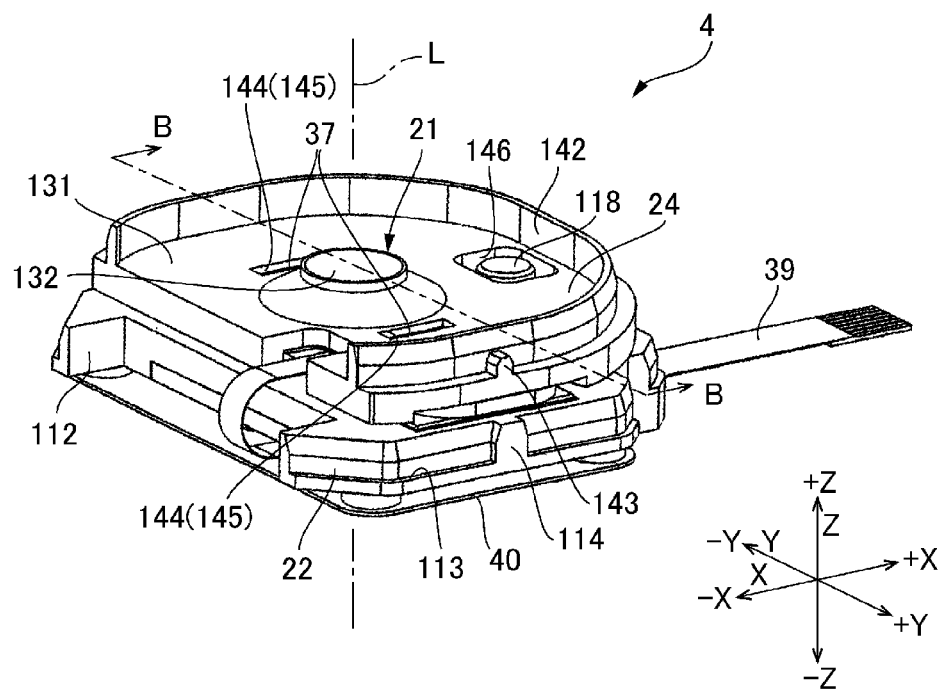
FIG. 9A is a perspective view of a second unit, in which the second unit is seen from the object side.
Figure 9B:
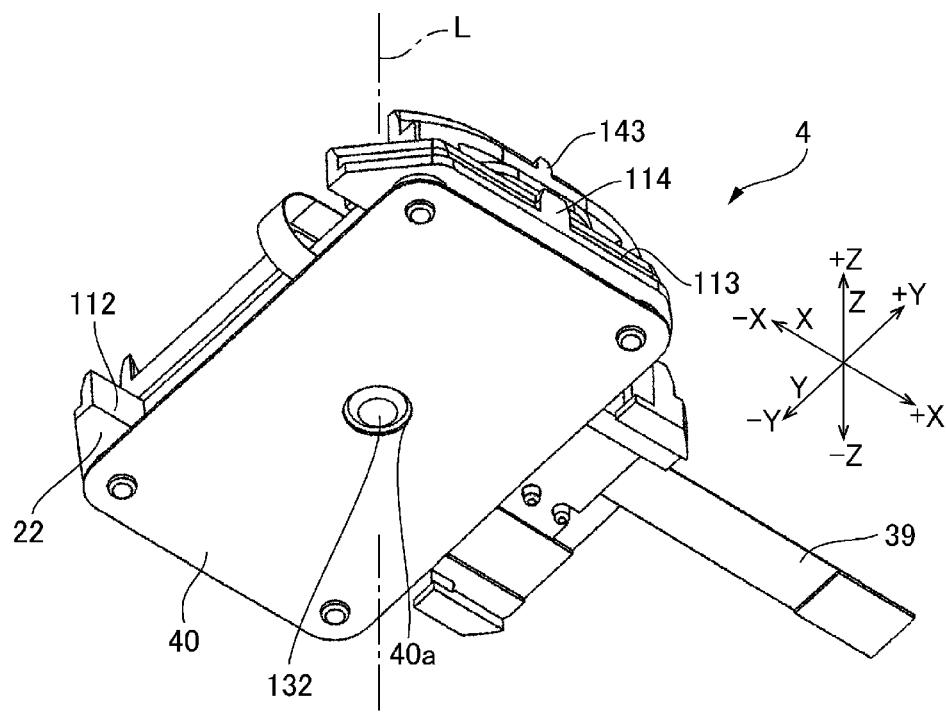
FIG. 9B is a perspective view of the second unit, in which the second unit is seen from the counter-object side.
Figure 10:
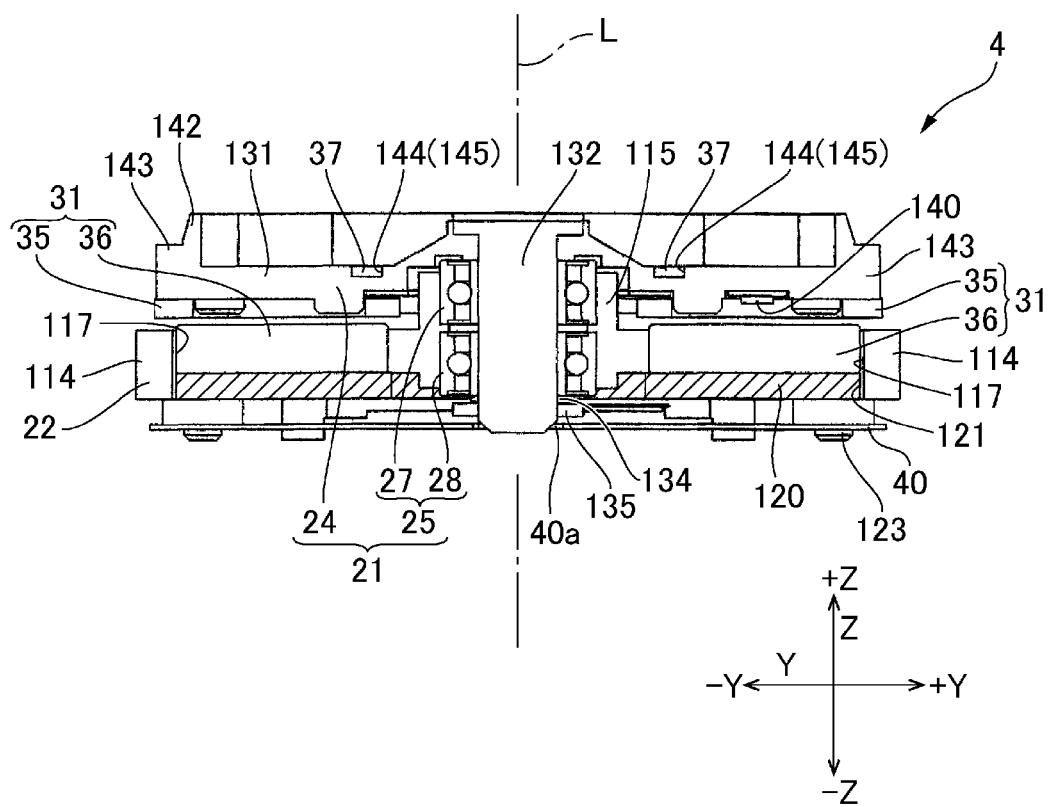
FIG. 10 is a cross-sectional view of the second unit taken along a line B-B of FIG. 9A.
Figure 11:
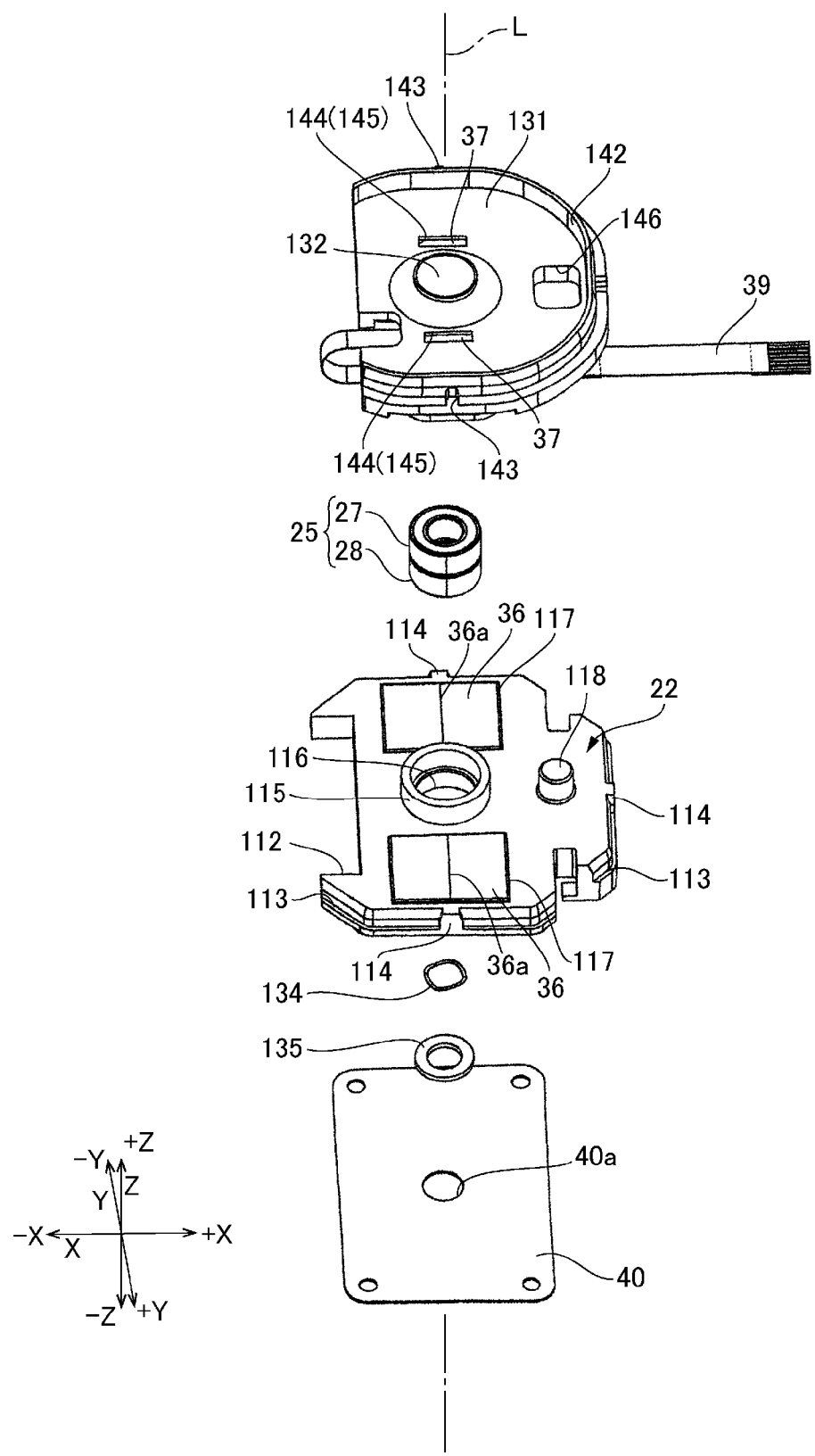
FIG. 11 is an exploded perspective view of the second unit, in which the second unit is seen from the object side.
Figure 12:
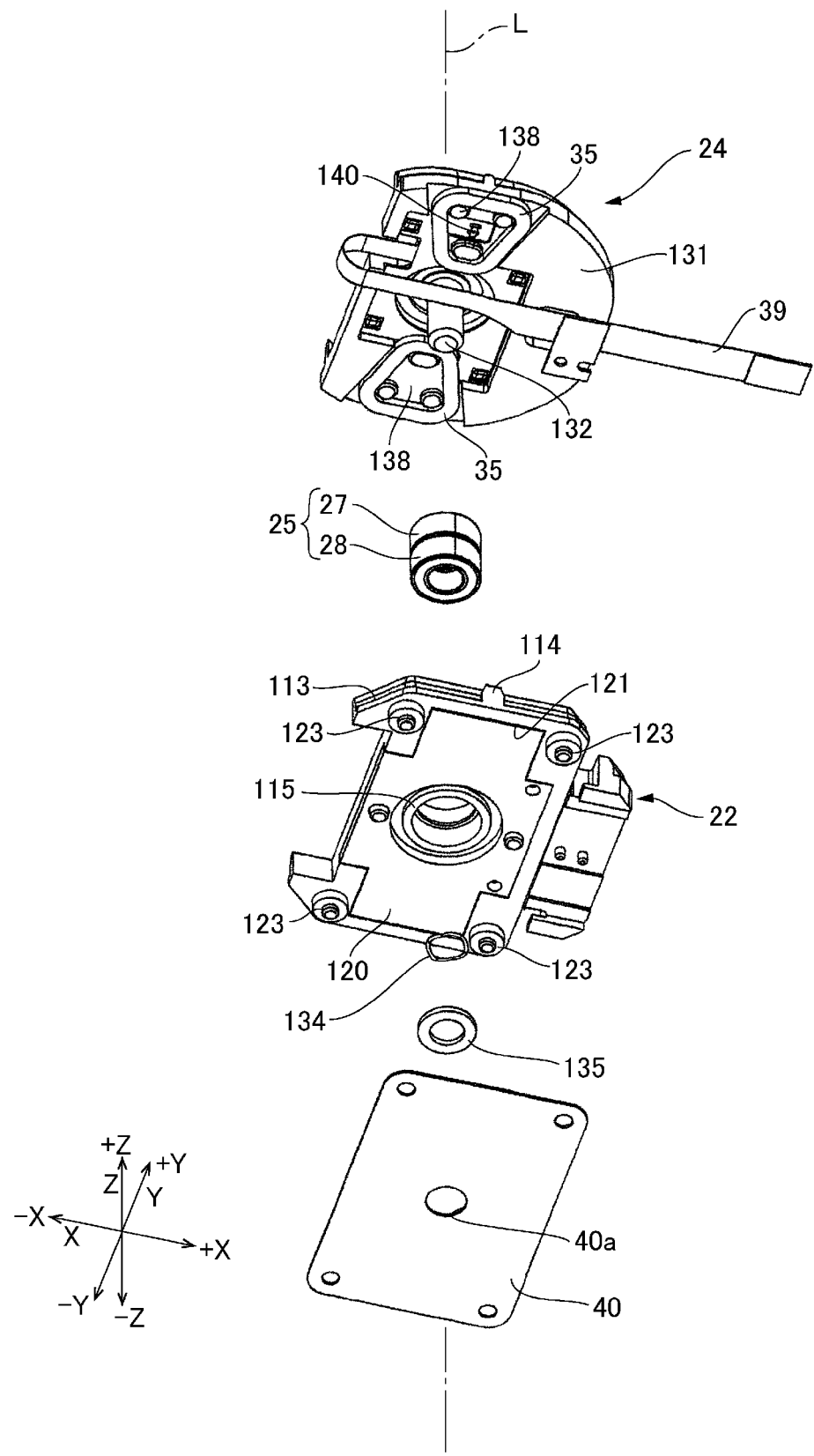
FIG. 12 is an exploded perspective view of the second unit, in which the second unit is seen from the counter-object side.
Figure 13:
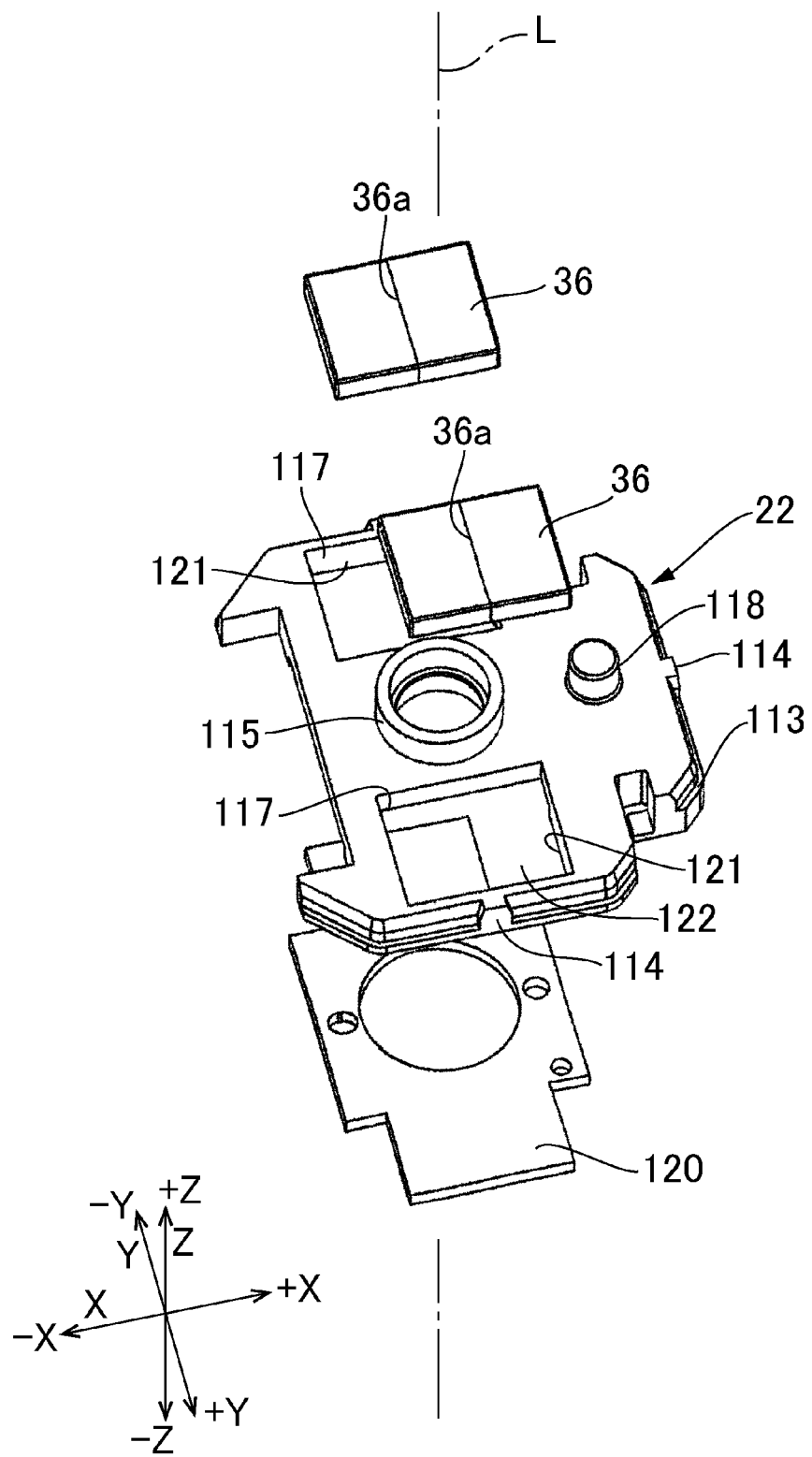
FIG. 13 is an exploded perspective view of a fixation member, in which the fixation member is seen from the object side.

FIG. 9A is a perspective view of the second unit 4, in which the second unit 4 is seen from the +Z-direction side, and FIG. 9B is a perspective view of the second unit 4, in which the second unit 4 is seen from the −Z-direction side. FIG. 10 is a cross-sectional view of the second unit 4 taken along the line B-B of FIG. 9A. FIG. 11 is an exploded perspective view of the second unit 4, in which the second unit 4 is seen from the +Z-direction side (i.e., the object side). FIG. 12 is an exploded perspective view of the second unit 4, in which the second unit 4 is seen from the −Z-direction side (i.e., the counter-object side). FIG. 13 is an exploded perspective view of a fixation member 22, rolling driving magnets 36, and a yoke 120. As illustrated in FIGS. 9A and 9B and FIG. 10, the second unit 4 includes: a rotation-supporting mechanism 21 that supports the holder 7 such that the holder 7 is able to rotate on the axis L; a fixation member 22 that supports the holder 7 via the rotation-supporting mechanism 21; a flexible printed circuit board 39; and a cover member 40. The rotation-supporting mechanism 21 includes: a rotation seat 24; and a bearing mechanism 25 (i.e., the first ball bearing 27 and the second ball bearing 28).

As illustrated in FIG. 11, the fixation member 22 is in a flat shape that is thin in the Z-axis direction. The fixation member 22 includes a rectangular cutout part 112 at the bottom end-edge portion in the −X direction. The fixation member 22 includes a stepped part 113 at the outer-circumferential-edge-portion, except at the cutout part 112. On the stepped part 113, there are provided three protrusion parts 114 that protrude in the +X direction, the +Y direction, and the −Y direction, respectively.

As illustrated in FIG. 11 and FIG. 12, the fixation member 22 includes, at the center with respect to the Y-axis direction, a cylinder part 115 that protrudes in the +Z direction and in the −Z direction. The central hole 116 of the cylinder part 115 penetrates the fixation member 22 in the Z-axis direction. As illustrated in FIG. 10, on the inner circumferential side of the cylinder part 115, the first ball bearing 27 and the second ball bearing 28 are held. In other words, the cylinder part 115 holds the outer ring of the first ball bearing 27 and the outer ring of the second ball bearing 28 from the outer circumferential side.

Furthermore, as illustrated in FIG. 11, the fixation member 22 includes a pair of rolling-driving-magnet-holding depression parts 117 on the +Z-direction-end-surface. The pair of rolling-driving-magnet-holding depression parts 117 are provided on both side such that the cylinder part 115 is therebetween. To each of the rolling-driving-magnet-holding depression parts 117, a rolling driving magnet 36 is inserted and fixed. Each of the rolling driving magnets 36 is protected by the fixation member 22 from the outer circumferential side. Here, the rolling driving magnet 36 is polarized and magnetized with respect to the circumferential direction. The magnetization-polarized line 36a of each rolling driving magnet 36 is at the center of the rolling driving magnet 36 with respect to the circumferential direction and extends in the radial direction. Furthermore, the fixation member 22 includes, at a position apart from the cylinder part 115 in the +X direction, a rotation-stopper projection part 118 that protrudes in the +Z direction.

Furthermore, as illustrated in FIG. 12, the fixation member 22 includes a yoke-holding depression part 121 on the −Z-direction-end-surface (i.e., the non-opposed surface). The yoke-holding depression part 121 is provided such that the yoke-holding depression part 121 encloses the cylinder part 115. The yoke-holding depression part 121 extends in the Y-axis direction and, when the yoke-holding depression part 121 is seen in the Z-axis direction, the yoke-holding depression part 121 includes overlapping portions that overlap the pair of rolling-driving-magnet-holding depression parts 117. As illustrated in FIG. 13, the overlapping portions form rectangular communicating parts 122 through which the rolling-driving-magnet-holding depression parts 117 and the yoke-holding depression part 121 communicate in the Z-axis direction. To the yoke-holding depression part 121, the yoke 120 is inserted from the −Z direction. The yoke 120 is formed of magnetic material. The yoke 120 abuts against the rolling driving magnets 36, which are held by the rolling-driving-magnet-holding depression parts 117, from the −Z direction via the communicating parts 122.

Furthermore, as illustrated in FIG. 12, the fixation member 22 includes, on the outer circumferential side of the yoke-holding depression part 121, four cover-member-fixation projection parts 123 that protrude in the −Z direction. Two of the four cover-member-fixation projection parts 123 are provided on both sides of the +Y-direction-end-edge-portion of the fixation member 22 such that the yoke-holding depression part 121 is therebetween in the X-axis direction. The other two of the four cover-member-fixation projection parts 123 are provided on both sides of the −Y-direction-end-edge-portion of the fixation member 22 such that the yoke-holding depression part 121 is therebetween in the X-axis direction. To the four cover-member-fixation projection parts 123, the cover member 40 is fixed from the −Z direction. The cover member 40 covers the yoke 120 from the −Z direction. At the center of the cover member 40, there is provided an opening part 40a that is in a circular shape. As illustrated in FIG. 9B, when the cover member 40 is fixed to the fixation member 22, the tip of the shaft part 132 is inserted to the opening part 40a. Here, as illustrated in FIG. 9B, the flexible printed circuit board 39 is drawn between the fixation member 22 and the cover member 40.

Next, as illustrated in FIG. 12, the rotation seat 24 includes: a flat seat main body 131 that is thin in the Z-axis direction; and the shaft part 132 that protrudes in the −Z direction from the seat main body 131. As illustrated in FIG. 10, the shaft part 132 is inserted to the first ball bearing 27 and the second ball bearing 28 that are held by the cylinder part 115 of the fixation member 22. That is to say, the shaft part 132 is held by the inner rings of the first ball bearing 27 and the second ball bearing 28 from the outer circumferential side. The shaft part 132 penetrates the first ball bearing 27 and the second ball bearing 28, and the tip portion of the shaft part 132 protrudes in the −Z direction from the second ball bearing 28. To the tip portion of the shaft part 132, a spring washer 134 is inserted. Furthermore, to the tip portion of the shaft part 132, an annular member 135 is fixed by means of welding, etc. Here, the spring washer 134 is compressed between the inner ring of the second ball bearing 28 and the annular member 135, and therefore imposes a pressure on the first ball bearing 27 and the second ball bearing 28. That is to say, the spring washer 134 and the annular member 135, which is fixed to the tip portion of the shaft part 132, configure a pressure-imposing mechanism.

As illustrated in FIG. 12, regarding the seat main body 131, on both sides of the surface (i.e., the opposed surface) that is opposed to the fixation member 22, there is provided a pair of coil fixation parts 138 such that the shaft part 132 is therebetween. On the pair of coil fixation parts 138, the rolling driving coils 35 are held in such a posture that the central holes of the rolling driving coils 35 face in the Z-axis direction. To the inside of the rolling driving coil 35 that is fixed to one of the coil fixation parts 138, there is fixed a Hall element 140. The Hall element 140 is positioned at the center of the rolling driving coil 35 with respect to the circumferential direction. The Hall element 140 is electronically connected to the flexible printed circuit board 39, which is electronically connected to the rolling driving coil 35.

As illustrated in FIG. 11, regarding the end-surface on the +Z-direction side of the seat main body 131, on the outer-circumferential-end-portion that is offset to the inside from the outer-circumferential-end by a predetermined width, there is provided a peripheral wall 142 formed in a substantially U-shape that encloses the end-surface from the +X direction and from both sides in the Y-axis direction. On the peripheral wall 142, there are provided three protrusion parts 143 that protrude in the +X direction, the +Y direction, and the −Y direction, respectively.

Furthermore, regarding the end-surface on the +Z-direction side of the seat main body 131, there are provided fixation regions 144, to which the angular-position-recovering magnetic members 37 are fixed, on both sides such that the cylinder part 115 is therebetween in the Y-axis direction. The fixation regions 144 are grooves 145 having predetermined widths that are parallelly extend in the X-axis direction. An angular-position-recovering magnetic member 37 is in a shape of a square pole whose dimension of the circumferential direction (i.e., the X-axis direction) is longer than the dimension of the radial direction. Furthermore, the dimension of the circumferential direction (i.e., the X-axis direction) of an angular-position-recovering magnetic member 37 is shorter than the dimension of the circumferential direction (i.e., the X-axis direction) of a groove 145.

An angular-position-recovering magnetic member 37 is fixed inside a groove 145 (i.e., inside a fixation region 144) in such a posture that the longitudinal direction is oriented in the circumferential direction. The position to fix an angular-position-recovering magnetic member 37 is adjusted inside a groove 145 (i.e., inside a fixation region 144), and then the angular-position-recovering magnetic member 37 is fixed inside the groove 145 (i.e., inside the fixation region 144) by use of an adhesive agent, such that, when the rotation seat 24 being at a predetermined reference angular position is seen in the Z-axis direction, the center of the angular-position-recovering magnetic member 37 is at such a position that overlaps the magnetization-polarized line 36a of a rolling driving magnet 36.

Here, the seat main body 131 includes an opening part 146 at a different position from the fixation regions 144 with respect to the circumferential direction. In the present embodiment, the opening part 146 is provided at a position apart from the shaft part 132 in the +X direction.

(Rolling Magnetic Driving Mechanism)

As illustrated in FIGS. 9A and 9B and FIG. 10, when the rotation seat 24 is held by the fixation member 22 via the first ball bearing 27 and the second ball bearing 28, a rolling magnetic driving mechanism 31 is configured. As illustrated in FIG. 10, the rolling magnetic driving mechanism 31 includes a pair of rolling magnetic driving mechanisms 31 that are held on both sides of the rotation seat 24 such that the shaft part 132 is therebetween. Each rolling magnetic driving mechanism 31 includes: a rolling driving coil 35 that is held by the rotation seat 24; and a rolling driving magnet 36 that is held by the fixation member 22 and is opposed to a corresponding rolling driving coil 35 in the Z-axis direction. The rolling driving magnet 36 is separated into two with respect to the circumferential direction and magnetized such that the magnetic poles on the surface that is opposed to the rolling driving coil 35 are different with reference to the magnetization-polarized line 36a. The rolling driving coils 35 are coreless coils, and the long edge portions extending in the radial direction are utilized as effective edges. When the rotation seat 24 is at a predetermined reference angular position, the Hall element 140 is opposed to the magnetization-polarized line 36a of the swing driving magnet 14 positioned in the −Z direction.

(Rotation-Stopper Mechanism)

Furthermore, as illustrated in FIG. 9A, when the rotation seat 24 is held by the fixation member 22 via the first ball bearing 27 and the second ball bearing 28, the rotation-stopper projection part 118 of the fixation member 22 is inserted to the opening part 146 of the rotation seat 24. Hence, the rotation-stopper projection part 118 of the fixation member 22 and the opening part 146 of the rotation seat 24 configure the rotation-stopper mechanism 38 that restrains the rotation-angle range of the rotation seat 24 that rotates on the Z-axis. That is to say, the rotation seat 24 rotates on the Z-axis in such a range that the rotation-stopper projection part 118 does not interfere with the inner wall (i.e., the abutting part) of the opening part 146. In other words, the rotation-stopper mechanism 38 restrains the rotation-angle range of the rotation seat 24 in such a way that the inner wall of the opening part 146 abuts the rotation-stopper projection part 118 from the circumferential direction.

(Angular-Position-Recovering Mechanism)

Figure 14A:
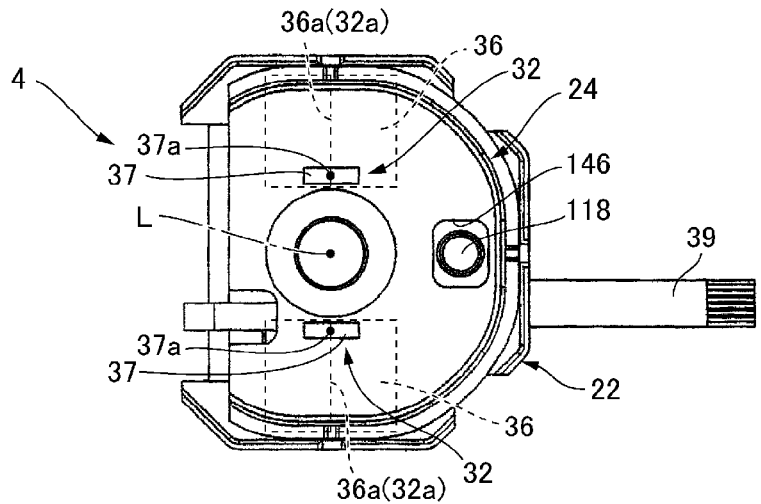
FIG. 14A is an explanatory diagram of an angular-position-recovering mechanism.
Figure 14B:
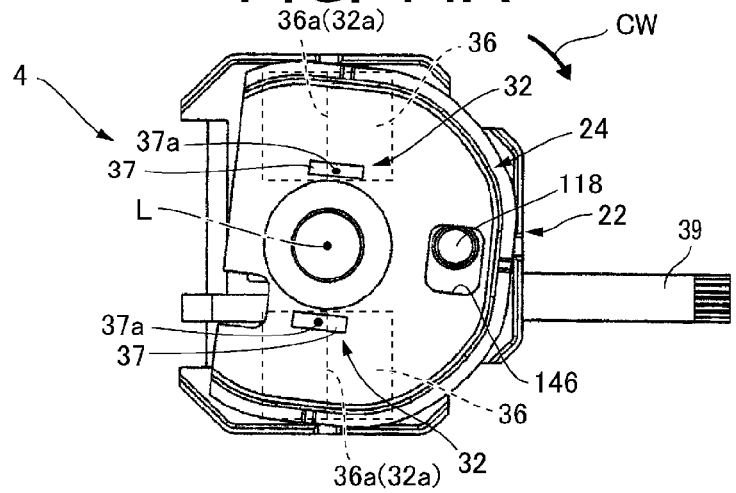
FIG. 14B is an explanatory diagram of the angular-position-recovering mechanism.
Figure 14C:
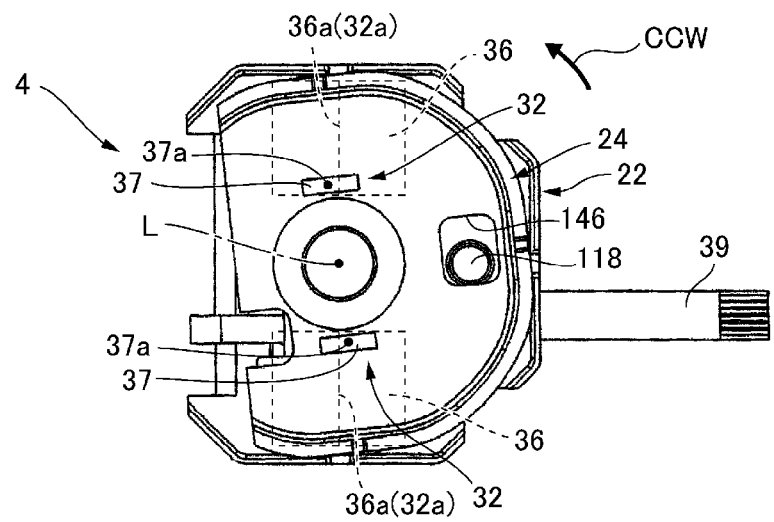
FIG. 14C is an explanatory diagram of the angular-position-recovering mechanism.

FIGS. 14A through 14C are explanatory diagrams of the angular-position-recovering mechanism 32. As illustrated in FIGS. 14A through 14C, the angular-position-recovering mechanism 32 includes: angular-position-recovering magnetic members 37; and rolling driving magnets 36. As illustrated in FIG. 10, the angular-position-recovering magnetic members 37 are arranged on the opposite side of the rolling driving magnets 36 with reference to the rolling driving coils 35 such that the rolling driving coils 35 are therebetween in the Z-axis direction. Furthermore, as illustrated in FIG. 14A, when the rotation seat 24 being at a reference angular position while being supported by the fixation member 22 via the bearing mechanism 25 such that the rotation seat 24 is able to rotate is seen from the Z-axis direction, the center 37a of an angular-position-recovering magnetic member 37 is at such a position that overlaps the magnetization-polarized line 36a of a rolling driving magnet 36, which is positioned in the −Z direction. In other words, in a state where the rotation seat 24 is at the reference angular position, a virtual surface 32a that includes a magnetization-polarized line 36a and extends parallelly to the axis L would pass through the center 37a of an angular-position-recovering magnetic member 37.

Next, as illustrated in FIGS. 14B and 14C, when the rotation seat 24 rotates in the CW direction or in the CCW direction relative to the reference position of rotation, the center 37a of an angular-position-recovering magnetic member 37 moves away from the magnetization-polarized line 36a of a rolling driving magnet 36 in the circumferential direction. Hence, between the angular-position-recovering magnetic member 37 and the rolling driving magnet 36, magnetic attractive force is exerted in such a direction that the center 37a of the angular-position-recovering magnetic member 37 is forced toward the side where there is the magnetization-polarized line 36a of the rolling driving magnet 36. That is to say, when the rotation seat 24 rotates from the reference angular position, magnetic attractive force in such a direction that the rotation seat 24 is forced to recover to the reference angular position is exerted between an angular-position-recovering magnetic member 37 and a rolling driving magnet 36. Accordingly, an angular-position-recovering magnetic member 37 and a rolling driving magnet 36 function as an angular-position-recovering mechanism 32 that causes the rotation seat 24 to recover to the reference angular position.

Note that, in the state illustrated in FIG. 14B, the inner wall of the opening part 146, which is formed on the rotation seat 24, abuts against the rotation-stopper projection part 118 of the fixation member 22 from one side of the circumferential direction, so as to restrain the rotation seat 24 from further rotating in the CW direction. Furthermore, in the state illustrated in FIG. 14C, the inner wall of the opening part 146, which is formed on the rotation seat 24, abuts against the rotation-stopper projection part 118 of the fixation member 22 from the other side of the circumferential direction, so as to restrain the rotation seat 24 from further rotating in the CCW direction. Accordingly, the rotation seat 24 rotates in an angular range that is from the angular position as illustrated in FIG. 14B to the angular position as illustrated in FIG. 14C.

Here, as illustrated in FIGS. 14A through 14C, while the rotation seat 24 rotates in the predetermined angular range, an angular-position-recovering magnetic member 37 overlaps a virtual surface 32a that includes the magnetization-polarized line 36a of a rolling driving magnet 36 and extends parallelly to the axis L, and the angular-position-recovering magnetic member 37 does not get off the virtual surface 32a. Therefore, by means of the angular-position-recovering mechanism 32, it is possible to surely generate magnetic attractive force in such a direction that the center 37a of an angular-position-recovering magnetic member 37 is forced back toward a position that overlaps the magnetization-polarized line 36a of a rolling driving magnet 36. Accordingly, it is possible to surely cause the movable unit 5 that has rotated to recover to a reference angular position.

(Attachment of the First Unit to the Second Unit)

Here, when the first unit 3 is attached to the second unit 4, the peripheral wall 142 of the second unit 4 is inserted to the bottom end-portion of the holder body part 63 of the holder 7. Further, the protrusion parts 143 (i.e., the position-determining parts), which protrude from the peripheral wall 142 of the second unit 4, are inserted to the position-determining cutout parts 67, which are provided in the holder body part 63. Accordingly, the holder 7 is fixed to the rotation seat 24 while the position of the holder 7 with respect to the radial direction and the circumferential direction is determined. Furthermore, when the first unit 3 is attached to the second unit 4, the portion on the +Z-direction side of the stepped part 113, which is provided on the outer circumferential edge of the fixation member 22, is inserted to the bottom end-portion of the cylindrical casing 45. Further, the protrusion parts 114, which are provided on the stepped part 113, are inserted to the position-determining cutout parts 56, which are provided in the cylindrical casing 45. Accordingly, the casing member 8 is fixed to the fixation member 22 while the position of the casing member 8 with respect to the radial direction and the circumferential direction is determined, so as to configure the fixation member 42. In the above way, the optical unit 1 is assembled.

(Shake Correction of the Optical Unit)

As described above, regarding the optical unit 1, the first unit 3 includes the swing magnetic driving mechanism 11 that is configured to perform shake correction on the X-axis and shake correction on the Y-axis direction. Therefore, shake correction in the pitching (i.e., vertical swing) direction and the yawing (i.e., transverse swing) direction is possible. Furthermore, regarding the optical unit 1, the second unit 4 includes the rolling magnetic driving mechanism 31 that is configured to cause the holder 7 of the first unit 3 to rotate, and therefore it is possible to perform shake correction in the rolling direction. Here, the optical unit 1 includes a gyroscope in the movable unit 5, and therefore the optical unit 1 detects shake on three axes that are orthogonal to each other by use of the gyroscope, so as to drive the swing magnetic driving mechanism 11 and the rolling magnetic driving mechanism 31 such that the detected shake is offset.

(Functional Effects)

In the present embodiment, the second unit 4 (i.e., the rolling magnetic driving unit) is configured independently from the first unit 3 (i.e., the optical unit with swing function). Therefore, an optical unit with shake correction function that causes an optical module 2 to swing and rotate can be easily configured, by attaching the first unit 3, which includes a shake correction function by way of swinging, to the second unit 4. Furthermore, in the present embodiment, a rolling driving coil 35 and a rolling driving magnet 36 of the rolling magnetic driving mechanism 31 are opposed to each other in the Z-axis direction, and therefore it is possible to avoid the second unit 4 from becoming large in size in the radial direction.

Furthermore, in the present embodiment, the rotation seat 24 of the second unit 4 is provided with: the peripheral wall 142 that is inserted to and engaged with the holder body part 63 of the holder 7 of the first unit 3; and the protrusion parts 143 that are latched with the position-determining cutout parts 67, which are provided in the holder body part 63. Therefore, it is possible to mount the first unit 3 (i.e., the optical module 2) on the second unit 4 with the optical axis corresponding to the Z-axis.

Furthermore, the second unit 4 includes the angular-position-recovering mechanism 32 for causing the rotation seat 24 to recover to the reference angular position of rotation on the Z-axis. Therefore, the rotation seat 24, which has been rotated, can easily be caused to recover to the reference angular position. Accordingly, the optical module 2, which is attached to the rotation seat 24 via the holder 7, can easily be caused to recover to the reference angular position.

Here, the angular-position-recovering mechanism 32 includes an angular-position-recovering magnetic member 37 and a rolling driving magnet 36. Therefore, there is no need to dispose a plate spring, etc., to bridge over the rotation seat 24 and the fixation member 22 for the purpose of causing the optical module 2 (i.e., the holder 7) to recover to the reference angular position. Hence, as there is no need to ensure a movable range for a plate spring, which is provided for an angular-position-recovering purpose, it is possible to downsize a device. Furthermore, although a plate spring is deformed or damaged when a relative rotation angle of rotation of the rotation seat 24 and the fixation member 22 is large, the angular-position-recovering magnetic member 37 and the rolling driving magnet 36 do not have any parts that are mechanically connected. Therefore, it is possible to enlarge the relative rotation angle.

Furthermore, an angular-position-recovering magnetic member 37 is arranged on the other side of a rolling driving magnet 36 with reference to a rolling driving coil 35 such that the rolling driving coil 35 is therebetween in the Z-axis direction. Therefore, as the angular-position-recovering magnetic member 37 functions as a back yoke, it is possible to improve the torque of the rolling magnetic driving mechanism to rotate the movable unit 5. Furthermore, as an angular-position-recovering magnetic member 37 is arranged on the other side of a rolling driving magnet 36 with reference to a rolling driving coil 35 such that the rolling driving coil 35 is therebetween, it is possible to ensure a relatively long distance between the angular-position-recovering magnetic member 37 and the rolling driving magnet 36. Therefore, it is easy to ensure linearity of magnetic attractive force that is generated between an angular-position-recovering magnetic member 37 and a rolling driving magnet 36 in accordance with a rotation angle of the movable unit 5.

Furthermore, in the present embodiment, an angular-position-recovering magnetic member 37 is fixed after the position to fix the angular-position-recovering magnetic member 37 is adjusted inside a fixation region 144 (i.e., inside a groove 145), which is provided in the rotation seat 24. That is to say, the rotation seat 24 includes a fixation region 144 to which an angular-position-recovering magnetic member 37 is fixed, and the position of fix the angular-position-recovering magnetic member 37 can be changed inside the fixation region 144. Therefore, by changing the position to fix the angular-position-recovering magnetic member 37 inside the fixation region 144, it is possible to define a reference angular position of the movable unit 5. Furthermore, by changing the position to fix the angular-position-recovering magnetic member 37 inside the fixation region 144 in the radial direction, it is possible to change an amount of magnetic attractive force (i.e., torque) to be generated between the angular-position-recovering magnetic member 37 and the rolling driving magnet 36 when the movable member 41 rotates.

Furthermore, in the present embodiment, as a rolling magnetic driving mechanism 31, there are provided a pair of rolling magnetic driving mechanisms 31 that are held on both sides of the rotation seat 24 such that the shaft part 132 is therebetween. Further, there are provided two angular-position-recovering magnetic members 37 that are respectively attracted by rolling driving magnets 36 of each rolling magnetic driving mechanisms 31. Hence, it is possible to surely cause the movable member 41 to recover to the reference angular position.

Furthermore, the rolling magnetic driving mechanism 31 includes a yoke 120 on the other side of rolling driving coils 35 with reference to rolling driving magnets 36. Hence, the torque of the rolling magnetic driving mechanism 31 to rotate the rotation seat 24 is improved.

Here, the rolling driving magnets 36 and the yoke 120 are fixed inside depression parts (i.e., the rolling-driving-magnet-holding depression parts 117 and the yoke-holding depression part 121) that are provided in the fixation member 22. Therefore, it is possible to prevent the rolling driving magnets 36 and the yoke 120 from protruding from the fixation member 22, which makes it easy to handle the second unit 4. Furthermore, a rolling driving coil 35 is fixed to a coil fixation part 138, which is provided at a position of the rotation seat 24 (i.e., the opposed surface) that is opposed to the fixation member 22, and therefore the rolling driving coil 35 is positioned between the fixation member 22 and the rotation seat 24 with respect to the Z-axis direction. Therefore, rolling driving coils 35 do not protrude from the fixation member 22 and the rotation seat 24 toward the outer circumferential side, which makes it easy to handle the second unit 4.

Furthermore, in the present embodiment, there is provided a rotation-stopper mechanism 38 to restrain a rotation-angle range of the rotation seat 24, and therefore it is possible to restrain the rotation-angle range of rotation by the rotation seat 24.

Furthermore, in the present embodiment, the rotation-supporting mechanism 21 includes: the shaft part 132 that extends from the rotation seat 24 toward the fixation member 22 in the Z-axis direction; and the first ball bearing 27 and the second ball bearing 28 that are attached to the outer circumferential side of the shaft part 132. As the rotation seat 24 is supported by the two ball bearings 27 and 28, the rotation seat 24 does not tilt relative to the axis L, and therefore the rotation seat 24 does not swing while rotating.

Furthermore, the flexible printed circuit board 39 is connected to a rolling driving coil 35, and the flexible printed circuit board 39 is drawn between the fixation member 22 and the cover member 40. Therefore, it is possible to prevent the flexible printed circuit board 39 from being unstable while handling the second unit 4.

Note that, in the above embodiment, the optical module 2 is supported by the rotation seat 24 of the second unit 4 while being supported by the holder 7 via the swing-supporting mechanism 6. However, it is possible that the optical module 2 is directly attached to the rotation seat 24. In this case, the optical unit 1 is an optical unit with shake correction function that causes a built-in optical module 2 to rotate on an optical axis for the purpose of avoiding jitter in a captured image.

Furthermore, in the above embodiment, the rolling driving coils 35 and the angular-position-recovering magnetic members 37 are attached to the rotation seat 24, and the rolling driving magnets 36 are fixed to the fixation member 22. However, it is possible that the rolling driving coils 35 and the angular-position-recovering magnetic members 37 are attached to the fixation member 22, and the rolling driving magnets 36 are fixed to the rotation seat 24.

Note that it is possible to dispose a plate spring to bridge over the rotation seat 24 and the fixation member 22 for configuration of the angular-position-recovering mechanism 32. In the above case, the rotation seat 24 is caused to recover to a reference angular position by use of elastic recovering force of the plate spring, which deforms between the rotation seat 24 and the fixation member 22 in accordance with rotation of the rotation seat 24.

(Variation Example of the Second Unit)

Figure 15A:
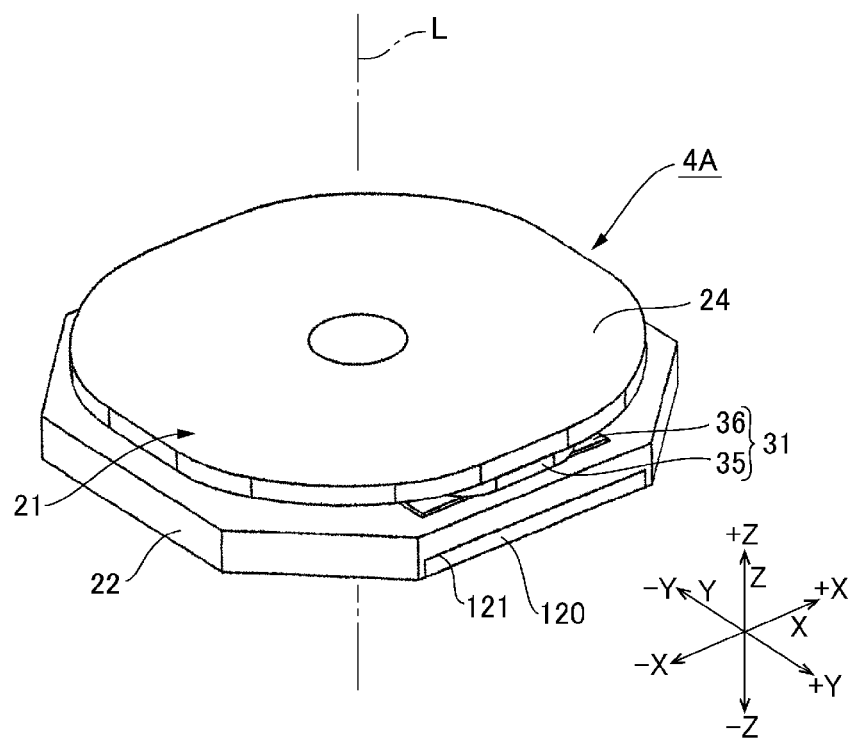
FIG. 15A is a perspective view of a second unit of a variation example.
Figure 15B:
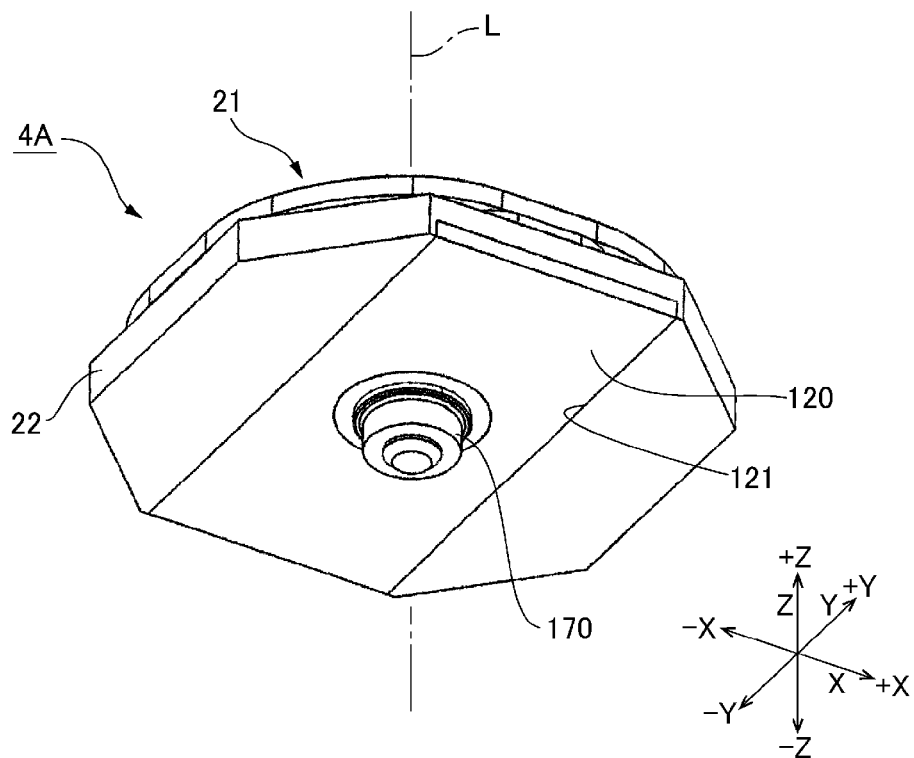
FIG. 15B is a perspective view of the second unit of the variation example.
Figure 16:
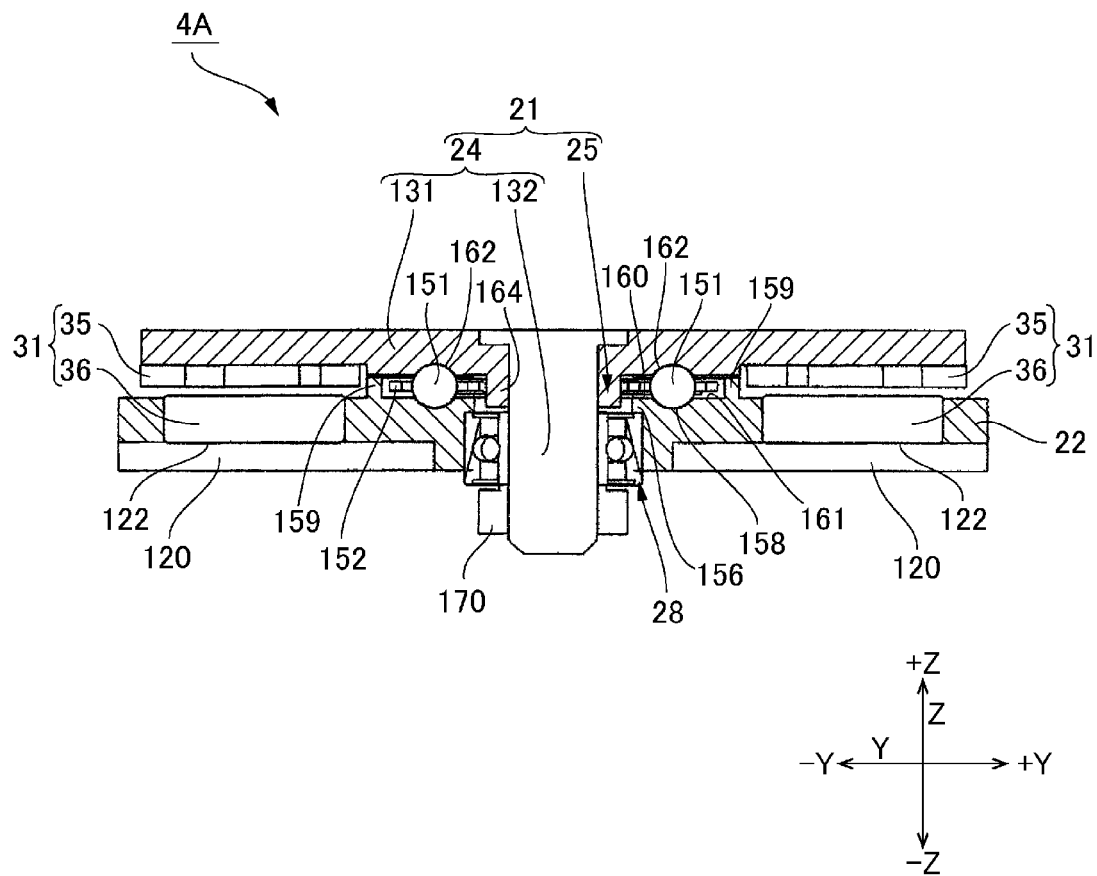
FIG. 16 is a cross-sectional view of the second unit of the variation example.
Figure 17:
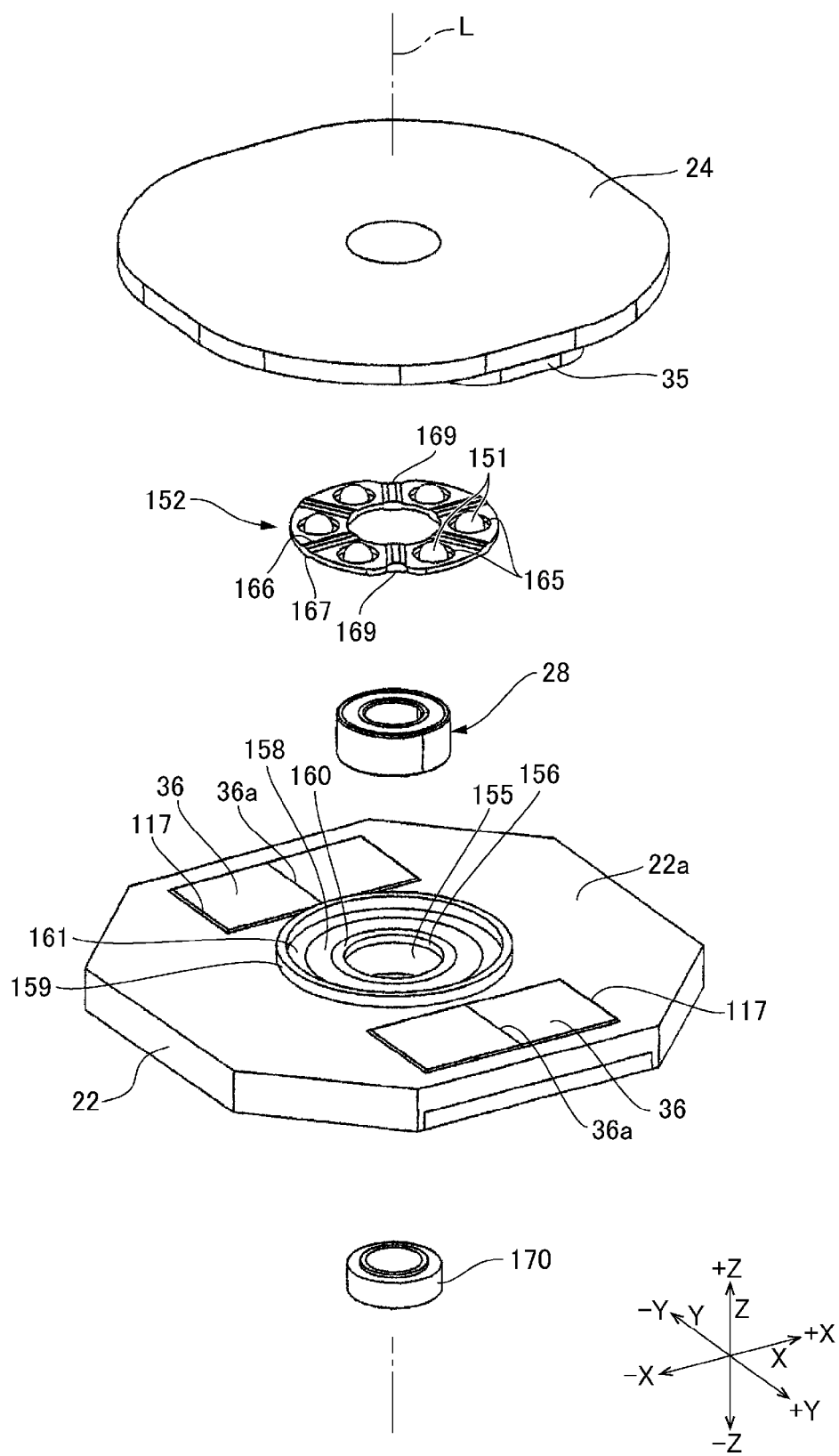
FIG. 17 is an exploded perspective view of the second unit of the variation example, in which the second unit of the variation example is seen from the object side.
Figure 18:
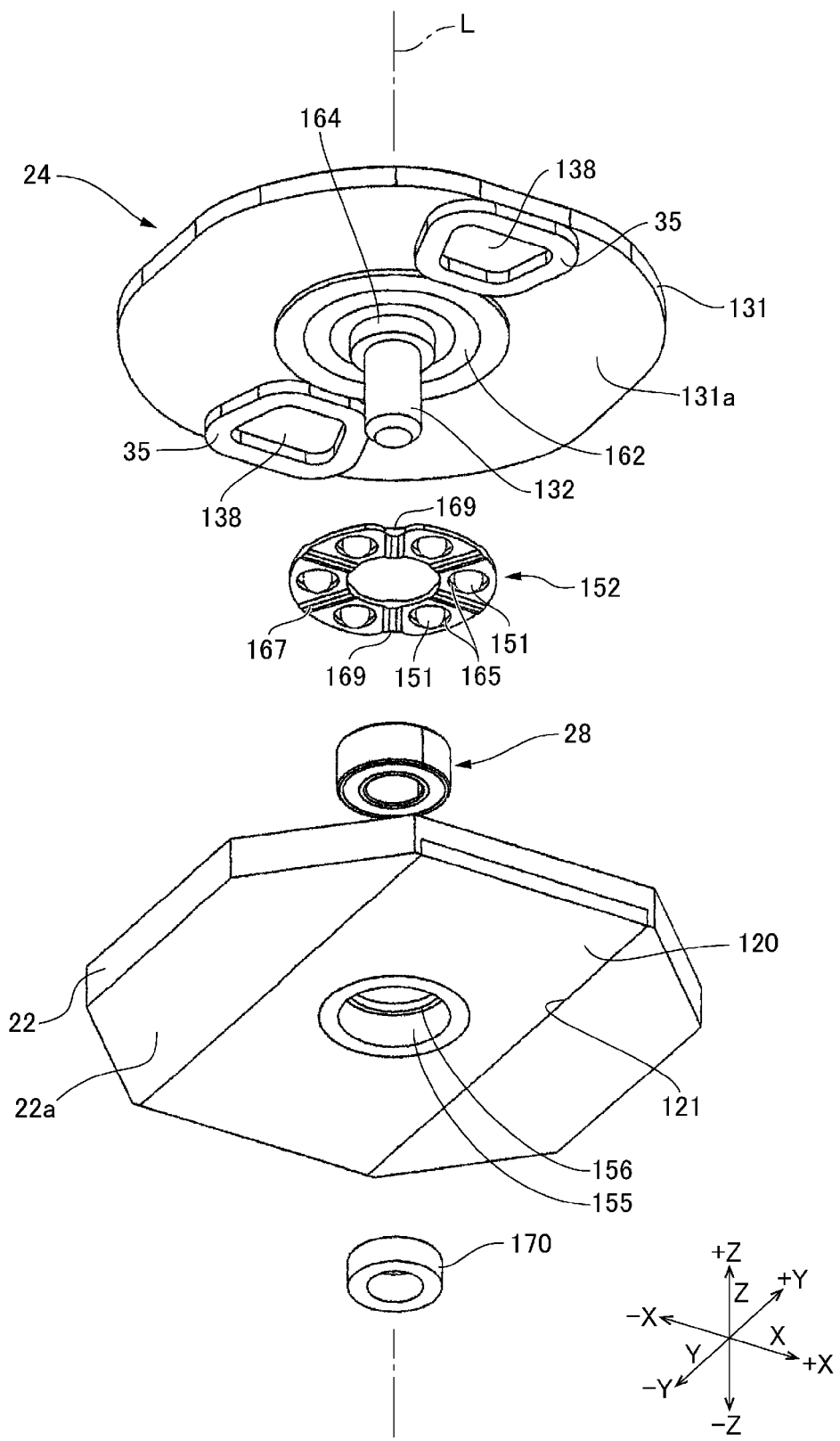
FIG. 18 is an exploded perspective view of the second unit of the variation example, in which the second unit of the variation example is seen from the counter-object side.

FIG. 15A is a perspective view of a second unit of a variation example, in which the second unit of the variation example is seen from the +Z-direction side, and FIG. 15B is a perspective view of the second unit of the variation example, in which the second unit of the variation example is seen from the −Z-direction side. FIG. 16 is a cross-sectional view of the second unit of the variation example. FIG. 17 is an exploded perspective view of the second unit of the variation example, in which the second unit of the variation example is seen from the +Z-direction side (i.e., the object side). FIG. 18 is an exploded perspective view of the second unit of the variation example, in which the second unit of the variation example is seen from the −Z-direction side (i.e., the counter-object side). The following description explains a second unit 4A of the variation example, with reference to FIGS. 15A through 18. Note that, as the second unit 4A of the variation example includes configurations that correspond to those in the above-described second unit 4, the corresponding configurations are assigned the same reference signs for the purpose of explanation. In FIGS. 15A thorough 18, the flexible printed circuit board 39 that is connected to a rolling driving coil 35 is omitted. Regarding the second unit 4A of the variation example, as with the above-described second unit 4, it is possible that the holder 7 of the first unit 3 is attached to the rotation seat 24 and the casing member 8 of the first unit 3 is fixed to the fixation member 22. Regarding the second unit 4A of the variation example, as with the above-described second unit 4, it is possible that the optical module 2 is directly attached to the rotation seat 24.

As illustrated in FIGS. 15A through 16, the second unit 4A includes: a rotation-supporting mechanism 21; and a fixation member 22 that is able to support the holder 7 via the rotation-supporting mechanism 21. As illustrated in FIG. 16, the rotation-supporting mechanism 21 includes a rotation seat 24 and a bearing mechanism 25. The bearing mechanism 25 includes a ball bearing 28. Furthermore, the bearing mechanism 25 includes: balls 151 (i.e., roll-moving members) that roll between the rotation seat 24 and the fixation member 22; and a retainer 152 that is arranged between the rotation seat 24 and the fixation member 22 and holds the balls 151 such that the balls 151 are able to move in a rolling manner.

As illustrated in FIG. 17, the fixation member 22 is in a flat shape that is thin in the Z-axis direction. The outline of the fixation member 22 is in an octagonal shape. As illustrated in FIG. 17 and FIG. 18, the fixation member 22 includes, at the central portion with respect to the Y-axis direction, a though hole 155 that penetrates in the +Z direction and the −Z direction. Furthermore, as illustrated in FIG. 16 and FIG. 17, the fixation member 22 includes, at the +X-direction-end-portion of the though hole 155, an annular protrusion part 156 that internally protrudes. As illustrated in FIG. 16, the ball bearing 28 is held on the inner circumferential side of the though hole 155. Accordingly, the fixation member 22 holds the outer ring of the ball bearing 28 from the outer circumferential side. Furthermore, the annular protrusion part 156 is abutted against from the −Z direction by the outer ring of the ball bearing 28.

Furthermore, as illustrated in FIG. 17, at a fixation-member-side opposed part 22a that is opposed to the rotation seat 24 in the +Z direction, the fixation member 22 includes: a fixation-member-side annular groove 158 that is coaxial with the Z-axis; and an annular rib 159 that encloses the fixation-member-side annular groove 158 from the outer circumferential side. The annular rib 159 is coaxial with the Z-axis. Between the though hole 155 and the fixation-member-side annular groove 158, there is provided an inner-circumferential-side annular surface 160 that is orthogonal to the Z-axis. Further, between the fixation-member-side annular groove 158 and the annular rib 159, there is provided an outer-circumferential-side annular surface 161 that is orthogonal to the Z-axis. The fixation-member-side annular groove 158 has a predetermined width and extends in the circumferential direction. The cross-sectional shape of the fixation-member-side annular groove 158 is an arc.

Furthermore, the fixation member 22 includes a pair of rolling-driving-magnet-holding depression parts 117 in the fixation-member-side opposed part 22a, which faces in the +Z direction. The pair of rolling-driving-magnet-holding depression parts 117 are provided on both sides with respect to the Y-axis direction such that the annular rib 159 is therebetween. To each rolling-driving-magnet-holding depression part 117, a rolling driving magnet 36 is inserted and fixed. Each rolling driving magnet 36 is protected by the fixation member 22 from the outer circumferential side. Here, the rolling driving magnet 36 is polarized and magnetized in the circumferential direction. The magnetization-polarized line 36a of each rolling driving magnet 36 is at the center of the rolling driving magnet 36 with respect to the circumferential direction and extends in the radial direction.

Furthermore, as illustrated in FIG. 18, the fixation member 22 includes a yoke-holding depression part 121 on the fixation-member-side opposed part 22a (i.e., the non-opposed surface) that faces in the −Z direction. The yoke-holding depression part 121 is provided such that the yoke-holding depression part 121 encloses the though hole 155. The yoke-holding depression part 121 extends in the Y-axis direction and, when the yoke-holding depression part 121 is seen in the Z-axis direction, the yoke-holding depression part 121 includes overlapping portions that overlap the pair of rolling-driving-magnet-holding depression parts 117. The overlapping portions form rectangular communicating parts 122 through which the rolling-driving-magnet-holding depression parts 117 and the yoke-holding depression part 121 communicate in the Z-axis direction (see FIG. 16). Therefore, when the yoke 120 is fixed inside the yoke-holding depression part 121, the yoke 120 abuts against the rolling driving magnets 36, which are held by the rolling-driving-magnet-holding depression parts 117, from the −Z direction via the communicating parts 122.

Next, as illustrated in FIG. 18, the rotation seat 24 includes: a seat main body 131 in a flat shape that is thin in the Z-axis direction; and a shaft part 132 that protrudes in the −Z direction from the seat main body 131. Furthermore, the rotation seat 24 includes a cylinder part 164 that protrudes in the −Z direction and holds the shaft part 132 from the outer circumferential side. In addition, with respect to the seat main body 131, on a seat-side opposed part 131a that is opposed to the fixation member 22 in the −Z direction, the rotation seat 24 includes a seat-side annular groove 162 that is provided such that the seat-side annular groove 162 encloses the shaft part 132 and is coaxial with the Z-axis. The seat-side annular groove 162 has a predetermined width and extends in the circumferential direction. Further, the cross-sectional shape of the seat-side annular groove 162 is circular. When the rotation seat 24 is supported by the fixation member 22 via the bearing mechanism 25 such that the rotation seat 24 is able to rotate, the seat-side annular groove 162 and the fixation-member-side annular groove 158 are opposed to each other in the Z-axis direction.

Furthermore, as illustrated in FIG. 18, the rotation seat 24 includes a pair of coil fixation parts 138 on the seat-side opposed part 131a of the seat main body 131. The pair of coil fixation parts 138 are provided on both side with respect to the Y-axis direction such that the seat-side annular groove 162 is therebetween. On each coil fixation part 138, a rolling driving coil 35 is held in such a posture that the central hole of the rolling driving coil 35 faces in the Z-axis direction.

Here, multiple balls 151 are arranged between the fixation member 22 and the rotation seat 24. The balls 151 are formed of metal or resin. The balls 151 are positioned on the outer circumferential side relative to the ball bearing 28.

As illustrated in FIG. 16, the retainer 152 is arranged between the fixation member 22 and the rotation seat 24 and, with respect to the radial direction, arranged between the annular rib 159 of the fixation member 22 and the cylinder part 164 of the rotation seat 24. The retainer 152 includes six through holes 165 that are aligned in the circumferential direction at an equal interval. The multiple balls 151 are inserted in the fixation-member-side annular groove 158 and the seat-side annular groove 162 while being arranged inside the multiple through holes 165, respectively. On the inner circumferential surfaces of the fixation-member-side annular groove 158 and the seat-side annular groove 162, lubricant oil is applied. As illustrated in FIG. 17 and FIG. 18, in the present embodiment, the numbers of the balls 151 and the through holes 165 are 6, respectively. The through holes 165 are provided around the axis L at an equal interval. The balls 151 move in a rolling manner in the fixation-member-side annular groove 158 and the seat-side annular groove 162 while being inserted in the through holes 165. Here, it is possible that the number of the balls 151 is three and the balls 151 are inserted to every other through hole 165 among six through holes 165. In the above case, each of the balls 151 is arranged around the axis L at a predetermined interval as well.

Furthermore, between two through holes 165 that are adjacent to each other in the circumferential direction, the retainer 152 includes: a first projection part 166 that protrudes toward the rotation seat 24; and a second projection part 167 that protrudes toward the fixation member 22. As illustrated in FIG. 17, a first projection part 166 extends in the radial direction and includes an arc surface that protrudes in the +Z direction from both sides toward the middle of the circumferential direction. As illustrated in FIG. 18, a second projection part 167 extends in the radial direction and includes an arc surface that protrudes in the −Z direction from both sides toward the middle of the circumferential direction. The middle portion of a first projection part 166 with respect to the circumferential direction is able to make contact in a sliding manner with the inner-circumferential-edge-portion and the outer-circumferential-edge-portion of the seat-side annular groove 162 of the rotation seat 24. Furthermore, the middle portion of a second projection part 167 with respect to the circumferential direction is able to make contact in a sliding manner with the inner-circumferential-edge-portion and the outer-circumferential-edge-portion of the fixation-member-side annular groove 158 of the fixation member 22 (i.e., the outer-circumferential-edge of the inner-circumferential-side annular surface 160 and the inner-circumferential-edge of the outer-circumferential-side annular surface 161). Note that, although the first projection parts 166 and second projection parts 167 are respectively provided between two through holes 165 that are adjacent to each other in the circumferential direction (i.e., at six positions), it is not necessary that the number is six. That is, it is only required that the first projection parts 166 and the second projection parts 167 are formed at multiple positions around the axis L at an equal interval, Furthermore, the retainer 152 includes cutout parts 169 at two locations that are apart from each other on the outer circumferential edge. In the present embodiment, the cutout parts 169 are provided at an angular interval of 180 degrees.

As illustrated in FIG. 16, the shaft part 132 is inserted in the ball bearing 28 that is held by the though hole 155 of the fixation member 22. That is to say, the shaft part 132 is held by the inner ring of the ball bearing 28 from the outer circumferential side. The shaft part 132 penetrates the ball bearing 28, and the tip of the shaft part 132 protrudes in the −Z direction from the ball bearing 28. Here, on the tip portion of the shaft part 132, there is provided a screw part. Further, a retaining screw 170 is screwed to the tip portion of the shaft part 132. The retaining screw 170 is a pressure-imposing mechanism that abuts against the inner ring of the ball bearing 28 and imposes a pressure on the ball bearing 28. That is to say, the retaining screw 170 imposes a position-pressure on the ball bearing 28. Note that it is possible to impose a pressure on the ball bearing 28 by arranging a spring washer 134 and an annular member 135 on the tip portion of the shaft part 132 and fixing the annular member 135 to the tip portion of the shaft part 132 such that the spring washer 134 is compressed between the inner ring of the ball bearing 28 and the annular member 135. That is to say, it is possible that the pressure-imposing mechanism is configured by: the annular member 135 that is fixed to the shaft part 132; and the spring washer 134 that is arranged such that the spring washer 134 is compressed between the ball bearing 28 and the annular member 135.

Here, the retaining screw 170, which is screwed to the tip portion of the shaft part 132, imposes a pressure directed in the +Z direction on the fixation member 22 via the ball bearing 28. In the above way, the rotation seat 24 and the fixation member 22 do not become separated in the Z-axis direction. Therefore, the balls 151 that are held by the retainer 152 do not fall off the space between the seat-side annular groove 162 of the rotation seat 24 and the fixation-member-side annular groove 158 of the fixation member 22. Therefore, the rotation seat 24 smoothly rotates relative to the fixation member 22.

Regarding the second unit 4A of the present embodiment, the bearing mechanism 25 includes: the ball bearing 28; and the multiple balls 151 that are arranged between the seat main body 131 and the fixation member 22 on the outer circumferential side of the ball bearing 28. Therefore, the rotation seat 24 is prevented from tilting relative to the axis L. Accordingly, the rotation seat 24 does not swing while rotating, and the rotation seat 24 rotates smoothly.

Furthermore, the balls 151 are positioned on the outer circumferential side of the ball bearing 28, and therefore do not overlap the ball bearing 28 in the Z-axis direction. Therefore, as the bearing mechanism 25 can be shortened in the Z-axis direction, it is possible to make the second unit 4A thinner in the Z-axis direction.

Furthermore, as a pressure in a direction toward the seat main body 131 is imposed on the fixation member 22 by the retaining screw 170, it is possible to prevent the fixation member 22 and the seat main body 131 from becoming separated. Accordingly, it is possible to prevent the balls 151 from falling off the space between the fixation member 22 and the seat main body 131.

Furthermore, the ball 151 move in a rolling manner in the seat-side annular groove 162 of the seat main body 131 and in the fixation-member-side annular groove 158 of the fixation member 22. Furthermore, the balls 151 move in a rolling manner inside the through holes 165 of the retainer 152. Therefore, behavior of the balls 151 are consistent. In addition, the retainer 152 includes: a first projection part 166 that is able to make contact in a sliding manner with the inner-circumferential-side edge-portion and the outer-circumferential-side edge-portion of the seat-side annular groove 162 of the rotation seat 24; and a second projection part 167 that is able to make contact in a sliding manner with the inner-circumferential-side edge-portion and the outer-circumferential-side edge-portion of the fixation-member-side annular groove 158 of the fixation member 22. Accordingly, posture of the retainer 152 is stable. Accordingly, the rotation seat 24 smoothly rotates relative to the fixation member 22.

Furthermore, the retainer 152 includes cutout parts 169 at two locations that are apart from each other on the outer circumferential side. Accordingly, by holding the retainer 152 via the cutout parts 169 using jigs, etc., it is possible to determine a posture (i.e., an angular position) of the retainer 152 around the axis L. Therefore, for example, when manufacturing a device, it is easy to arrange the balls 151 in the through holes 165 of the retainer 152.

Here, it is possible that the second unit 4A of the variation example includes an angular-position-recovering mechanism 32 as well. That is to say, a fixation region 144 to which an angular-position-recovering magnetic member 37 is fixed is provided on the seat-side opposed part 131a, which is on the +Z-direction side of the seat main body 131, so as to fix the angular-position-recovering magnetic member 37 to the fixation region 144. Similarly, in the above case, the position to fix the angular-position-recovering magnetic member 37 is adjusted inside the groove 145 (i.e., inside the fixation region 144), and then the angular-position-recovering magnetic member 37 is fixed such that, when a state in which the rotation seat 24 is at a predetermined reference angular position is seen in the Z-axis direction, the center of the angular-position-recovering magnetic member 37 overlaps the magnetization-polarized line 36a of a rolling driving magnet 36.

Furthermore, similarly, regarding the second unit 4A of the variation example, it is possible that a Hall element 140 is fixed inside a rolling driving coil 35 that is fixed to a coil fixation part 138 on one side. With a Hall element 140, it is possible to detect an angular position of the rotation seat 24 relative to the fixation member 22, based on an output from the Hall element 140.

Furthermore, similarly, it is possible that the second unit 4A of the variation example includes a rotation-stopper mechanism 38 (i.e., a rotation-angle range-restricting mechanism) that restrains the rotation-angle range of the rotation seat 24. In the above case, the rotation-stopper mechanism 38 can be easily provided by providing a rotation-stopper projection part 118 on either one of the fixation member 22 and the rotation seat 24 and providing an opening part 146 on the other one of the fixation member 22 and the rotation seat 24 and by inserting the rotation-stopper projection part 118 to the opening part 146.

Furthermore, it is possible to provide on the seat-side opposed part 131a, which is in the −Z direction relative to the fixation member 22, four cover-member-fixation projection parts 123, which protrude in the −Z direction, so as to fix the cover member 40, which is in a rectangular shape, to the cover-member-fixation projection parts 123. That is to say, it is possible that two of the four cover-member-fixation projection parts 123 are provided on the +Y-direction-end-edge-portion of the fixation member 22 such that a yoke-holding depression part 121 is therebetween in the X-axis direction, and the other two of the four cover-member-fixation projection parts 123 are provided on the −Y-direction-end-edge-portion of the fixation member 22 such that the yoke-holding depression part 121 is therebetween in the X-axis direction, so as to fix the cover member 40 to the tip portion of each cover-member-fixation projection part 123. In the above way, it is possible to cover and protect the yoke 120 with the cover member 40 from the −Z direction.

Furthermore, in the above case, it is possible to draw between the fixation member 22 and the cover member 40 a flexible printed circuit board that is connected to a rolling driving coil 35. Therefore, it is possible to prevent the flexible printed circuit board from being unstable when handling the second unit 4A.

While the description above refers to particular embodiments of the disclosure, it will be understood that many modifications may be made without departing from the spirit thereof. The accompanying claims are intended to cover such modifications as would fall within the true scope and spirit of the disclosure.

The presently disclosed embodiments are therefore to be considered in all respects as illustrative and not restrictive, the scope of the disclosure being indicated by the appended claims, rather than the foregoing description, and all changes which come within the meaning and range of equivalency of the claims are therefore intended to be embraced therein.

What is claimed is:

1. A rolling magnetic driving unit that causes an optical module provided with an optical element to rotate on an optical axis of the optical element, the rolling magnetic driving unit comprising:
    a rotation-supporting mechanism that includes
        a rotation seat for supporting the optical module and
        a bearing mechanism configured to support the rotation seat in such a manner that the rotation seat is able to rotate on a predetermined axis;
    a fixation member configured to support the optical module via the rotation-supporting mechanism; and
    a rolling magnetic driving mechanism configured to cause the rotation seat to rotate,
    wherein the rolling magnetic driving mechanism includes
        a coil that is fixed to either one of the rotation seat and the fixation member and
        a magnet that is fixed to the other one of the rotation seat and the fixation member and is opposed to the coil in a direction of the axis,
    wherein the rotation seat includes
        a seat main body and
        a shaft part extending from the seat main body toward the fixation member in the direction of the axis,
    wherein the bearing mechanism includes a ball bearing that is attached to an outer circumferential side of the shaft part.

2. The rolling magnetic driving unit according to claim 1 further comprising an angular-position-recovering mechanism configured to cause the rotation seat to recover to a reference angular position of rotation on the axis.

3. The rolling magnetic driving unit according to claim 2,
    wherein the magnet is polarized and magnetized in a circumferential direction,
    wherein the angular-position-recovering mechanism includes an angular-position-recovering magnetic member that is attached to one of the rotation seat and the fixation member to which the coil is fixed, and
    wherein, when a state in which the rotation seat is at the reference angular position is seen in the direction of the axis, a center of the angular-position-recovering magnetic member overlaps with a magnetization-polarized line of the magnet.

4. The rolling magnetic driving unit according to claim 3, wherein the angular-position-recovering magnetic member is positioned on an opposite side of the magnet with reference to the coil in such a manner that the coil is therebetween in the direction of the axis.

5. The rolling magnetic driving unit according to claim 4,
    wherein a fixation region to which the angular-position-recovering magnetic member is fixed is provided on the one of the rotation seat and the fixation member to which the coil is fixed, and
    wherein a position to which the angular-position-recovering magnetic member is fixed is changeable inside the fixation region.

6. The rolling magnetic driving unit according to claim 1,
    wherein the rolling magnetic driving mechanism includes a yoke that is positioned on an opposite side of the coil with reference to the magnet,
    wherein the fixation member includes
        a magnet-holding depression part provided on an opposed surface that is opposed to the rotation seat in the direction of the axis and
        a yoke-holding depression part provided on a non-opposed surface that faces toward an opposite side of the rotation seat in the direction of the axis,
    wherein the magnet is fixed to the magnet-holding depression part,
    wherein the yoke is fixed to the yoke-holding depression part, and
    wherein the coil is fixed to an opposed surface of the rotation seat, the opposed surface of the rotation seat being opposed to the fixation member.

7. The rolling magnetic driving unit according to claim 1 further comprising a rotation-angle-range-restraining mechanism configured to define a rotation-angle range of the rotation seat,
    wherein the rotation-angle-range-restraining mechanism includes
        a protrusion part protruding from either one of the rotation seat and the fixation member toward the other one of the rotation seat and the fixation member and
        an abutting part provided on the other one of the rotation seat and the fixation member in such a manner that the abutting part is able to abut against the protrusion part from a circumferential direction.

8. The rolling magnetic driving unit according to claim 1,
    wherein the fixation part includes
        a holding part in a cylindrical shape that is configured to hold the ball bearing from the outer circumferential side and
        a pressure-imposing mechanism configured to impose a pressure in the direction of the axis on the ball bearing from an opposite side of the rotation seat.

9. The rolling magnetic driving unit according to claim 8,
    wherein the bearing mechanism includes a second ball bearing that is attached on the outer circumferential side of the shaft part in such a manner that the second ball bearing is coaxial with the ball bearing,
    wherein the second ball bearing is positioned between the ball bearing and the rotation seat,
    wherein the holding part holds the ball bearing and the second ball bearing from the outer circumferential side, and
    wherein the pressure-imposing mechanism imposes the pressure on the second ball bearing via the ball bearing.

10. The rolling magnetic driving unit according to claim 8,
    wherein the bearing mechanism includes a plurality of roll-moving members that are provided on the outer circumferential side of the ball bearing and arranged between the rotation seat and the fixation member in the direction of the axis, and wherein the pressure-imposing mechanism imposes the pressure via the ball bearing in such a direction that pushes the fixation member toward the seat main body.

11. The rolling magnetic driving unit according to claim 10,
wherein the rotation seat includes a seat-side opposed part that is around the axis and is opposed to the fixation member,
wherein the fixation member includes a fixation-member-side opposed part that is opposed to the seat-side opposed part in the direction of the axis,
wherein the seat-side opposed part includes a seat-side annular groove enclosing the axis,
wherein the fixation-member-side opposed part includes a fixation-member-side annular groove that is opposed to the seat-side annular groove, and
wherein the plurality of roll-moving members are inserted in the seat-side annular groove and the fixation-member-side annular groove.

12. The rolling magnetic driving unit according to claim 11,
wherein the bearing mechanism includes a retainer in an annular shape enclosing the axis between the seat-side opposed part and the fixation-member-side opposed part,
wherein the retainer includes a plurality of through holes arranged in a circumferential direction, and
wherein the plurality of roll-moving members are inserted to the plurality of through holes, respectively.

13. The rolling magnetic driving unit according to claim 12,
wherein the retainer includes, between two of the plurality of through holes that are adjacent to each other in the circumferential direction,
a first projection part that protrudes toward the seat-side opposed part, and
a second projection part that protrudes toward the fixation-member-side opposed part,
wherein the first projection part is able to make contact in a sliding manner with an edge portion of the seat-side annular groove provided on the seat-side opposed part, and
wherein the second projection part is able to make contact in a sliding manner with an edge portion of the fixation-member-side annular groove provided on the fixation-member-side opposed part.

14. The rolling magnetic driving unit according to claim 12, wherein the retainer includes cutout parts at two distant locations on an outer circumferential edge.

15. The rolling magnetic driving unit according to claim 6 further comprising a cover member that is provided on an opposite side of the fixation member with reference to the rotation seat and is configured to cover the yoke in the direction of the axis from a position apart from the yoke,
wherein a flexible printed circuit board is connected to the coil, and
wherein the flexible printed circuit board is drawn between the yoke and the cover member.

16. The rolling magnetic driving unit according to claim 1,
wherein the rotation seat includes a position-determining part for fixing the optical module while making the optical axis and the axis corresponding to each other.

17. An optical unit with shake correction function comprising:
the rolling magnetic driving unit according to claim 1; and
an optical unit with shake correction function that is provided with
the optical module,
a swing-supporting mechanism configured to support the optical module in such a manner that the optical module is able to swing,
a supporting member configured to support the optical module via the swing-supporting mechanism, and
a swing magnetic driving mechanism configured to cause the optical module to swing,
wherein the optical module is attached to the rotation seat via the supporting member.

18. An optical unit with shake correction function comprising:
the rolling magnetic driving unit according to claim 1; and
the optical module,
wherein the optical module is attached to the rotation seat.

* * * * *